(12) United States Patent
Sudo et al.

(10) Patent No.: US 6,204,527 B1
(45) Date of Patent: Mar. 20, 2001

(54) SEMICONDUCTOR MEMORY DEVICE AND METHOD FOR PRODUCING SAME

(75) Inventors: Akira Sudo, Poughkeepsie; Kazumasa Sunouchi, Wappingers Falls, both of NY (US); Akihiro Nitayama, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/201,913

(22) Filed: Nov. 30, 1998

(30) Foreign Application Priority Data

Dec. 3, 1997 (JP) ..................................................... 9-333159

(51) Int. Cl.⁷ ..................................................... H01L 29/72
(52) U.S. Cl. .......................... 257/301; 257/304; 257/305; 257/306; 257/309; 257/622
(58) Field of Search ................................. 257/301, 304, 257/305, 306, 309, 622

(56) References Cited

U.S. PATENT DOCUMENTS 5,555,520 * 9/1996 Sudo et al. ........................... 257/301

* cited by examiner

Primary Examiner—Edward Wojciechowicz
(74) Attorney, Agent, or Firm—Banner & Witcoff, Ltd.

(57) ABSTRACT

A semiconductor memory device comprises: a semiconductor substrate; a semiconductor region of a first conductive type formed in the semiconductor substrate; a diffusion region of a second conductive type different from the first conductive type, the diffusion region being formed on the surface of the semiconductor region; a trench formed in the semiconductor substrate so as to be adjacent to the diffusion region; a capacitor insulator film formed on a portion of a side surface of the trench, which extends from a position at a predetermined depth of the trench to a bottom portion of the trench, and on a bottom surface of the trench; a storage node formed so that a surface of the storage node buried in the trench has the same depth as that of the predetermined depth; a first insulator film formed in a portion of the side surface of the trench above the position of the predetermined depth of the trench, the first insulator having a window in a region contacting the diffusion region; and a storage node electrode formed on the storage node so as to bury the trench, the uppermost surface of a region of the storage node electrode contacting the diffusion region via the window being formed of a mono-crystalline silicon region. Thus, it is possible to improve the charge holding characteristic of a memory cell without deteriorating the performance of a cell transistor.

14 Claims, 23 Drawing Sheets

A-A SECTION

SEMICONDUCTOR MEMORY DEVICE AND METHOD FOR PRODUCING SAME

BACKGROUND OF THE INVENTION

1. Field of The Invention

The present invention relates generally to a semiconductor memory device and a method for producing the same. More specifically, the invention relates to a semiconductor memory device which is used as a random access memory (RAM) having trench capacitors.

2. Related Background Art

Currently, RAMs having trench capacitors as cell capacitors are widely used. FIG. 22 shows a plan view of such a RAM, and FIG. 23 shows a sectional view taken along line A—A of FIG. 22. Memory cells connected to each bit line 50 are aligned with each other so that two adjacent memory cells serve as a set of memory cells. Cell transistors $30_1$, and $30_2$ serving as components of the memory cells of the same set have a common drain 35b, to which the bit line is connected via a contact 55 (see FIG. 2). To sources 35a, and $35a_2$ of the cell transistors $30_1$, and $30_2$, trench capacitors $60_1$, and $60_2$ are connected. Gate electrodes $31_i$ of the respective cell transistors $30_i$(i=1, 2) serve as word lines connected to the memory cells including the cell transistors $30_i$.

The trench capacitors of the adjacent set of memory cells connected to the same capacitor, e.g., the trench capacitors $60_1$, and $60_3$, are electrically isolated from each other by means of an insulator film 25. The trench capacitors $60_1$, $60_2$ and $60_3$ of the memory cells connected to the same bit line are aligned with each other.

Over the respective trench capacitors $60_1$ (i=1, 2, 3), pass-word lines $33_i$ are provided. The pass-word lines $33_i$ (i=1, 2, 3) serve as word lines for memory cells connected to a bit line adjacent to the bit line 50, to which the memory cells including the trench capacitors $60_i$ are connected.

FIG. 21 shows a sectional view of a memory cell of a conventional RAM having trench capacitors as cell capacitors of the memory cell. The RAM has a plurality of memory cells. Each of the memory cells has a cell transistor 30 and a trench capacitor 60. The cell transistor 30 has a gate electrode 31 formed on a p-type silicon substrate 1 via a gate insulator film 29, and a source region 35a and a drain region 35b which are n-type diffusion regions formed in the silicon substrate 1 so that the gate electrode 31 is sandwiched by the source region 35a and the drain region 35b.

On the other hand, the trench capacitor 60 comprises a capacitor insulator film 7 formed on the wall surface of a trench provided in the silicon substrate 1, a storage node 9 of a polycrystalline silicon film buried in the trench, a storage node electrode 41 of a polycrystalline silicon film formed on the storage node 9, and a plate electrode 27 of an n-type diffusion layer formed in the silicon substrate 1. Furthermore, n-type impurities are added to the polycrystalline silicon films forming the storage node 9 and the storage node electrode 41.

The storage node electrode 41 is electrically connected to the source electrode 35a of the cell transistor 30 via a side wall contact 42. Furthermore, on the side portions of the lower portion of the storage node electrode 41, a thick insulator film 40 is formed to prevent a vertical parasitic transistor from being formed. On the upper portion of the storage node electrode 41, an insulator film 44 is formed to electrically isolate the storage node electrode 41 from the pass-word line provided above the trench capacitor 60. The trench capacitors of the adjacent memory cells are electrically isolated from each other by means of the insulator film 25.

In the conventional RAM with the above described construction, since the thick insulator film 44 is formed in the upper portion of the trench capacitor 60, the depth of the side wall contact 42 is great, so that the lower surface of the side wall contact 42 is arranged below the source region 35a. In such a state, a depletion layer of a p-n junction between a p-well 2 and the storage node 9 contacts the side wall contact 42. Therefore, a leak current increases, so that the charge holding characteristic of the memory cell deteriorates. Furthermore, it is conceived that the depth of the source region 35a is increased in order to prevent the charge holding characteristic from deteriorating. In this case, there is a problem in that the punchthrough withstand voltage of the cell transistor 30 deteriorates.

SUMMARY OF THE INVENTION

It is therefore an object of the present invention to eliminate the aforementioned problems and to provide a semiconductor memory device which has a memory cell having a good charge holding characteristic without deteriorating the performance of a cell transistor, and a method for producing such a semiconductor memory device.

In order to accomplish the aforementioned and other objects, according to one aspect of the present invention, a semiconductor memory device comprises: a semiconductor substrate; a semiconductor region of a first conductive type formed in the semiconductor substrate; a diffusion region of a second conductive type different from the first conductive type, the diffusion region being formed on the surface of the semiconductor region; a trench formed in the semiconductor substrate so as to be adjacent to the diffusion region; a capacitor insulator film formed on a portion of a side surface of the trench, which extends from a position at a predetermined depth of the trench to a bottom portion of the trench, and on a bottom surface of the trench; a storage node formed so that a surface of the storage node buried in the trench has the same depth as that of the predetermined depth; a first insulator film formed in a portion of the side surface of the trench above the position of the predetermined depth of the trench, the first insulator having a window in a region contacting the diffusion region; and a storage node electrode formed on the storage node so as to bury the trench, the uppermost surface of a region of the storage node electrode contacting the diffusion region via the window being formed of a mono-crystalline silicon region.

Preferably, an MIS transistor is formed in the semiconductor region, and the diffusion region is one of the source and drain regions of the MIS transistor.

The thickness of an upper portion of the first insulator film on the side of the diffusion region is preferably less than the thickness of a lower portion of the first insulator film.

The semiconductor storage device may further comprise a second insulator film formed on the storage node electrode.

Preferably, the mono-crystalline silicon region and a region of a polycrystalline silicon are arranged on the uppermost surface of the storage node electrode in parallel, and the second insulator film comprises a third insulator film formed in the mono-crystalline silicon region, and a fourth insulator film formed in the polycrystalline silicon region, the fourth insulator film being thicker than the third insulator film.

The fourth insulator film is preferably buried in the storage node electrode.

Preferably, the MIS transistor has a gate insulator film which extends to a portion on the storage node electrode.

The gate insulator film is preferably a CVD oxide film or a silicon oxynitride film.

According to another aspect of the present invention, a method for producing a semiconductor storage device comprises the steps of: forming a trench in a mono-crystalline semiconductor substrate, in which a semiconductor region of a first conductive type is formed, so as to be adjacent to the semiconductor region; coating the inside of the trench with a capacitor insulator film; forming a storage node having an upper surface lower than the surface of the semiconductor substrate by burying a conductive material in the trench; forming a first insulator film on a side surface of the trench after removing the capacitor insulator film exposed to the side surface of the trench; forming a first conductive layer having an upper surface lower than the surface of the semiconductor substrate by burying a conductive material in the trench; forming a second insulator film, which is thinner than the first insulator film, on the side surface of the trench after removing the first insulator film exposed to the side surface of the trench; forming a second conductive layer by burying a conductive material in the trench; exposing the semiconductor region to the side surface of the trench by removing the first insulator film exposed to the side surface of the trench; depositing an amorphous silicon layer so as to bury the trench to form a third conductive layer which is made of a mono-crystalline silicon in an uppermost region contacting the semiconductor region and of a polycrystalline silicon in other regions; forming a recessed portion at the center of the upper surface of the third conductive layer; masking the uppermost region of the mono-crystalline silicon, which contacts the semiconductor region, and at least a part of the recessed portion to etch the third conductive layer and the semiconductor substrate; and forming an insulator film on the third conductive layer.

The step of forming the recessed portion is preferably carried out using an anisotropic etching, by which the polycrystalline silicon has a higher etch rate than that of the mono-crystalline silicon.

Preferably, the step of forming the recessed portion comprises steps of forming a pattern of an insulator film, which has an opening at the center thereof, on the third conductive layer, and using the pattern as a mask to carry out an anisotropic etching According to a further aspect of the present invention, a method for producing a semiconductor storage device comprising the steps of: forming a trench in a mono-crystalline semiconductor substrate, in which a semiconductor region of a first conductive type is formed, so as to be adjacent to the semiconductor region; coating the inside of the trench with a capacitor insulator film; forming a storage node having an upper surface lower than the surface of the semiconductor substrate by burying a conductive material in the trench; forming a first insulator film on a side surface of the trench after removing the capacitor insulator film exposed to the side surface of the trench; forming a first conductive layer having an upper surface lower than the surface of the semiconductor substrate by burying a conductive material in the trench; exposing the semiconductor region to the side surface of the trench by removing the first insulator film exposed to the side surface of the trench; depositing an amorphous silicon layer, to which an impurity of a second conductive type different from the first conductive type is added, so as to bury the trench to form a second conductive layer which is made of a mono-crystalline silicon in an uppermost region contacting the semiconductor region and of a polycrystalline silicon in other regions; forming a recessed portion at the center of the upper surface of the conductive layer; masking the uppermost region of the mono-crystalline silicon, which contacts the semiconductor region, and the recessed portion to etch the second conductive layer and the semiconductor substrate; and forming an insulator film on the second conductive layer.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of the present invention will be described.

Figure 1:
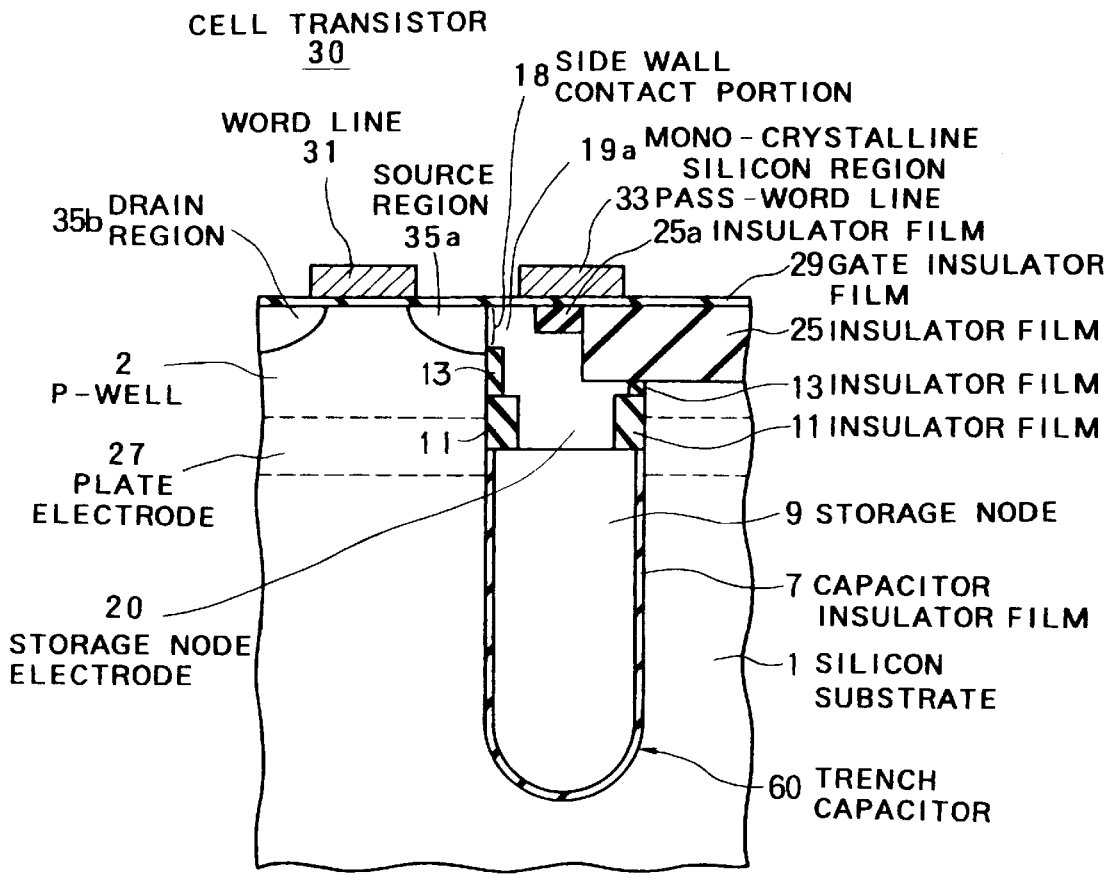
FIG. 1 is a sectional view of the first preferred embodiment of a semiconductor device according to the present invention.
Figure 22:
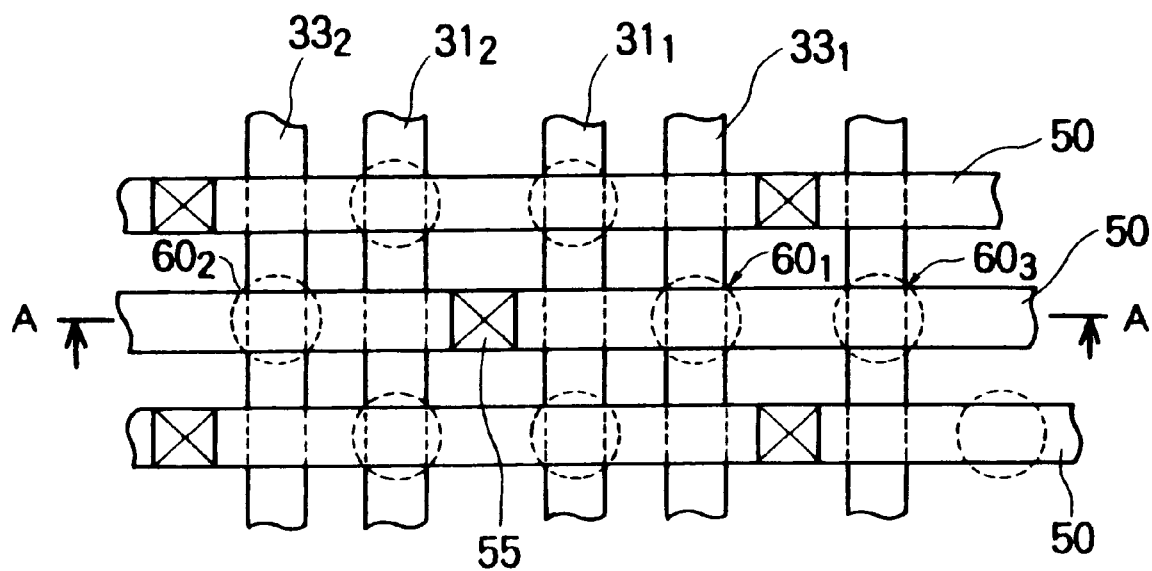
FIG. 22 is a plan view of a RAM having trench capacitors.
Figure 23:
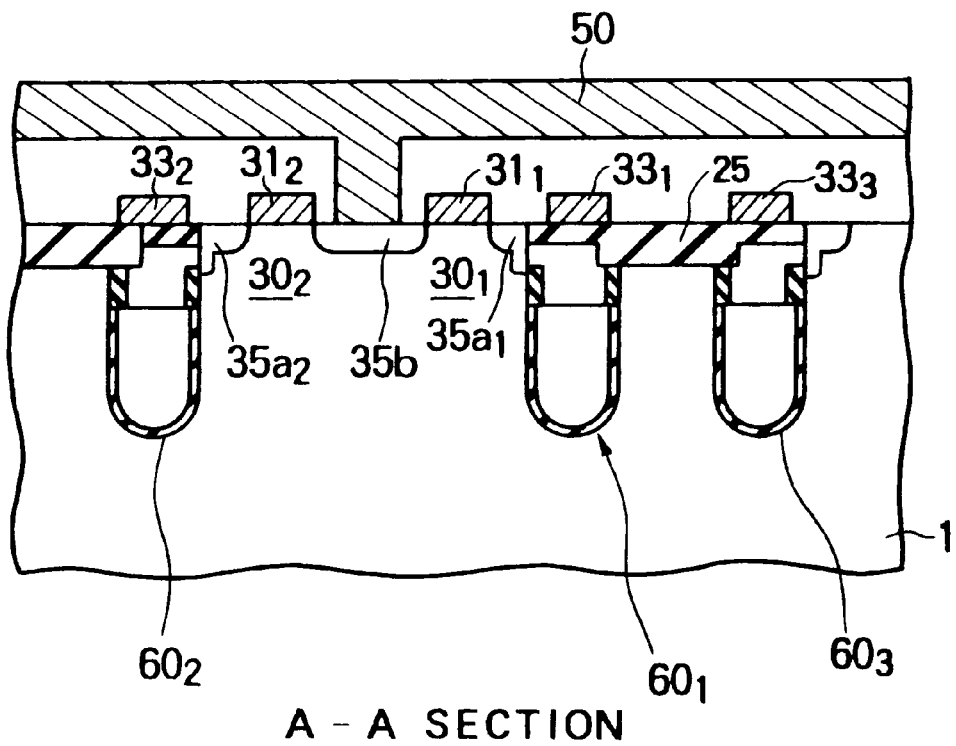
FIG. 23 is a sectional view of the RAM taken along of line A-A of FIG. 22.

FIG. 1 shows the first preferred embodiment of the present invention. In this first preferred embodiment, a RAM has a plurality of memory cells, each of which has a cell transistor 30 and a trench capacitor 60. Furthermore, the arrangement of the memory cells is the same as that in the conventional case shown in FIG. 22.

The cell transistor 30 is made of a metal insulator semiconductor (MIS) transistor. The cell transistor 30 has a gate electrode 31 formed on a p-well 2, which is formed in a silicon substrate 1, via a gate insulator film 29, and a source region 35a and a drain region 35b which are n-type impurity regions formed on the p-well 2 so that the gate electrode 31 is sandwiched between the source region 35a and the drain region 35b.

On the other hand, the trench capacitor 60 comprises a capacitor insulator film 7 formed on the wall surface of a trench provided in the silicon substrate 1, a storage node 9 of a polycrystalline silicon film buried in the trench, a storage node electrode 20 of a polycrystalline silicon film formed on the storage node 9, and a plate electrode 27 of an n-type diffusion layer formed in the silicon substrate 1. Furthermore, impurities are added to the polycrystalline silicon films forming the storage node 9 and the storage node electrode 20.

On the side surface of the lower portion of the storage node electrode 20, a thick insulator film 11 is formed. On the side surface of the storage node electrode 20 over the insulator film 11, an insulator film 13 thinner than the insulator film 11 is formed. A region of the insulator film 13 contacting the source region 35a has a window so that the source region 35a is not completely covered with the insulator film 13. Furthermore, the storage node electrode 20 is insulated from the p-well 2 by means of the insulator films 11 and 13.

In the upper portion of the storage node 20, a mono-crystalline silicon region 19a, to which an n-type impurity is added, and a thick insulator film 25a are arranged in parallel. The storage node electrode 20 is electrically connected to the source electrode 35a of the cell transistor 30 via the mono-crystalline silicon region 19a. Therefore, the interface between the mono-crystalline silicon region 19a and the source region 35a serves as a side wall contact 18.

Above the mono-crystalline silicon region 19a and the insulator film 25a, a pass-word line 33 is formed via a gate insulator film 29. The pass-word line 33 is electrically isolated from the storage node electrode 20 by means of the insulator film 25a. Furthermore, the trench capacitors of the adjacent memory cells are electrically isolated from each other by means of the insulator film 25.

In the first preferred embodiment of a semiconductor device having memory cells of the above described construction according to the present invention, no thick insulator film 25a exists above the side wall contact 18 unlike the conventional case, and the p-well 2 is insulated from the storage node electrode 20 by means of the insulator film 13, so that it is possible to prevent the side wall contact 18 from contacting the p-well under the source region 35a. Thus, it is possible to suppress a junction leak current, so that it is possible to obtain a good charge holding characteristic.

In addition, since the insulator film 13 is thin, it is possible to increase the gap between the insulator film 13 and the insulator film 25a, so that it is possible to decrease the resistance of the side wall contact portion of the storage node electrode 20.

Moreover, since the mono-crystalline silicon region 19a is arranged under the gate insulator film 29 under the pass-word line 33, it is possible to sufficiently ensure the isolation withstand voltage between the pass-word line 33 and the storage node electrode 20.

The second preferred embodiment of the present invention will be described below. In this second preferred embodiment, there is provided a method for producing the first preferred embodiment of a semiconductor storage device, according to the present invention, which is shown in FIG. 1. FIGS. 2 through 11 show sectional views of steps of the producing method.

Figure 2:
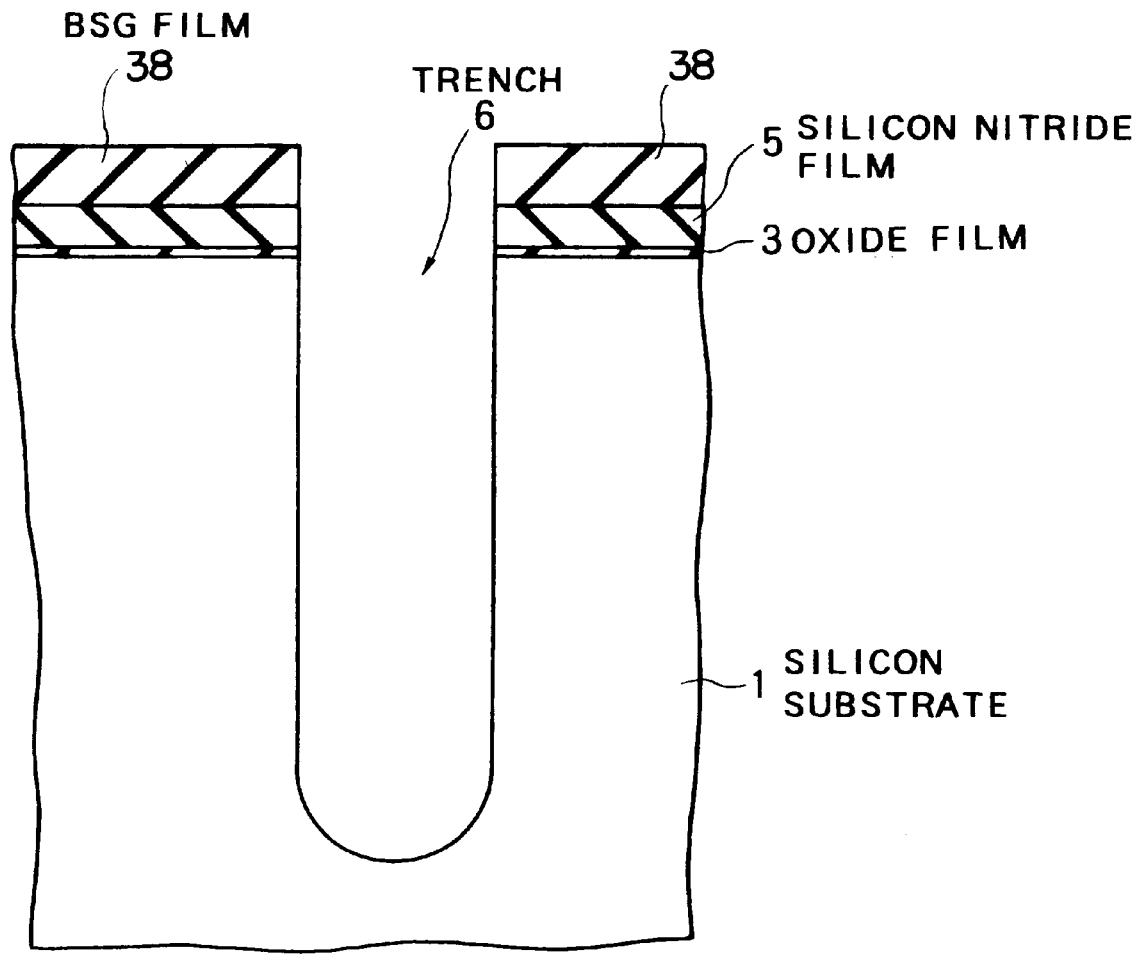
FIG. 2 is a sectional view showing a step in the second preferred embodiment of a method for producing a semiconductor device according to the present invention.
Figure 3:
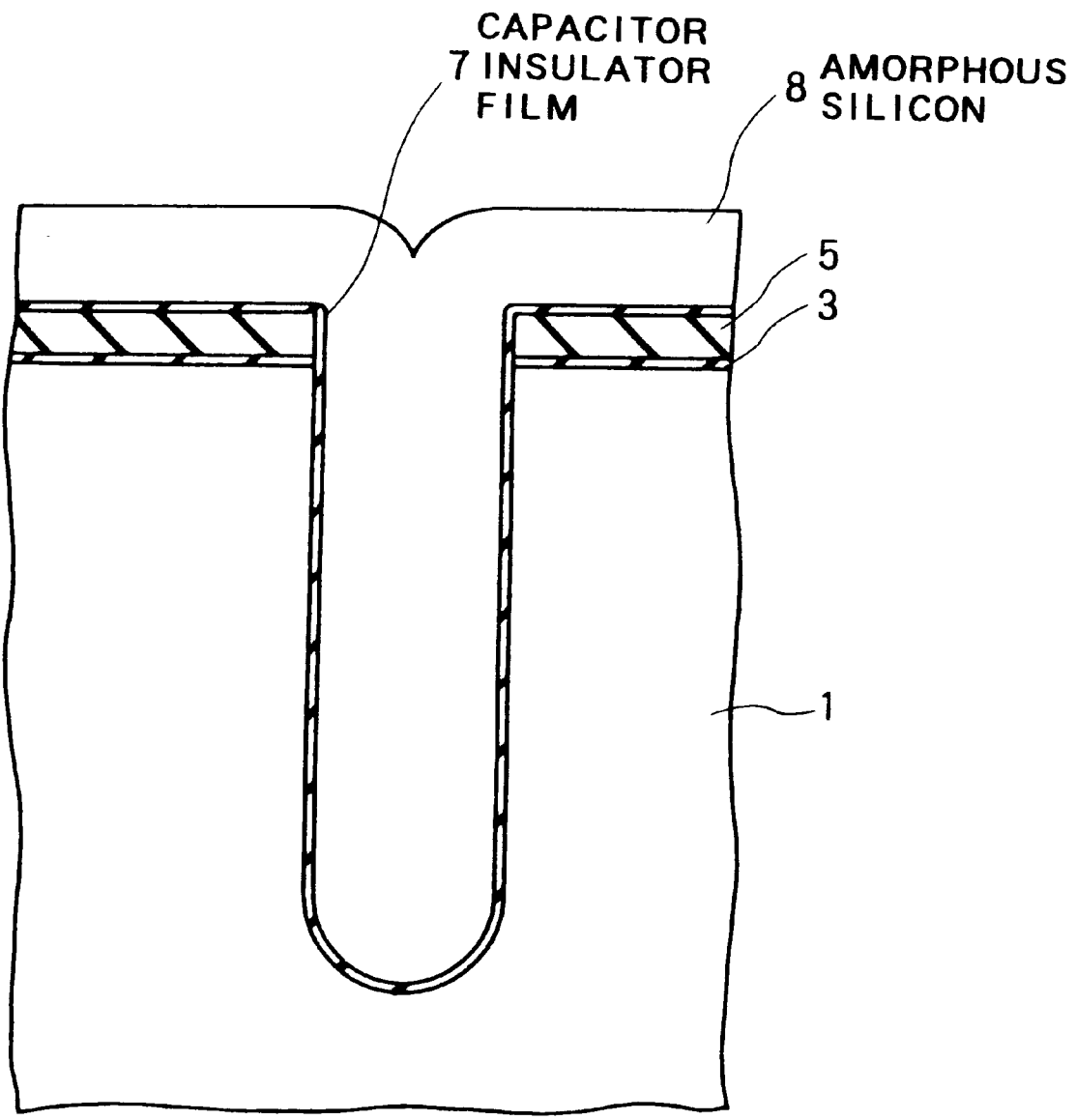
FIG. 3 is a sectional view showing a step in the second preferred embodiment of a method for producing a semiconductor device according to the present invention.

First, a silicon oxide film 3 is formed on a p-type silicon substrate 1 by the thermal oxidation (see FIG. 2). Subsequently, a silicon nitride film 5 and a boron containing silicon film 38 (which will be hereinafter referred to as a "BSG film") are deposited on the silicon oxide film 3 (see FIG. 2). Thereafter, a photoresist pattern (not shown) having an opening is formed on the silicon nitride film 5 at a trench capacitor forming region. Using the photoresist pattern as a mask, the silicon nitride film 5 is patterned by an anisotropic etching, e.g., the reactive ion etching (RIE). Then, using the patterned silicon nitride film 5 and BSG film 38 as masks, the oxide film 3 and the silicon substrate 1 are etched by the anisotropic etching to form a trench 6 having a depth of, e.g., 7 $\mu$m (see FIG. 2).

Then, the BSG film 38 is peeled off by HF. Subsequently, a capacitor insulator film 7 of a silicon nitride film and a silicon oxide film is formed on the surface of the trench 6 by the thermal oxidation method and the chemical vapor deposition (CVD) method (see FIG. 3). Thereafter, an amorphous silicon film 8, into which an n-type impurity (e.g., As) is doped, is deposited on the whole surface of the substrate so as to bury the trench 6 (see FIG. 3).

Figure 4:
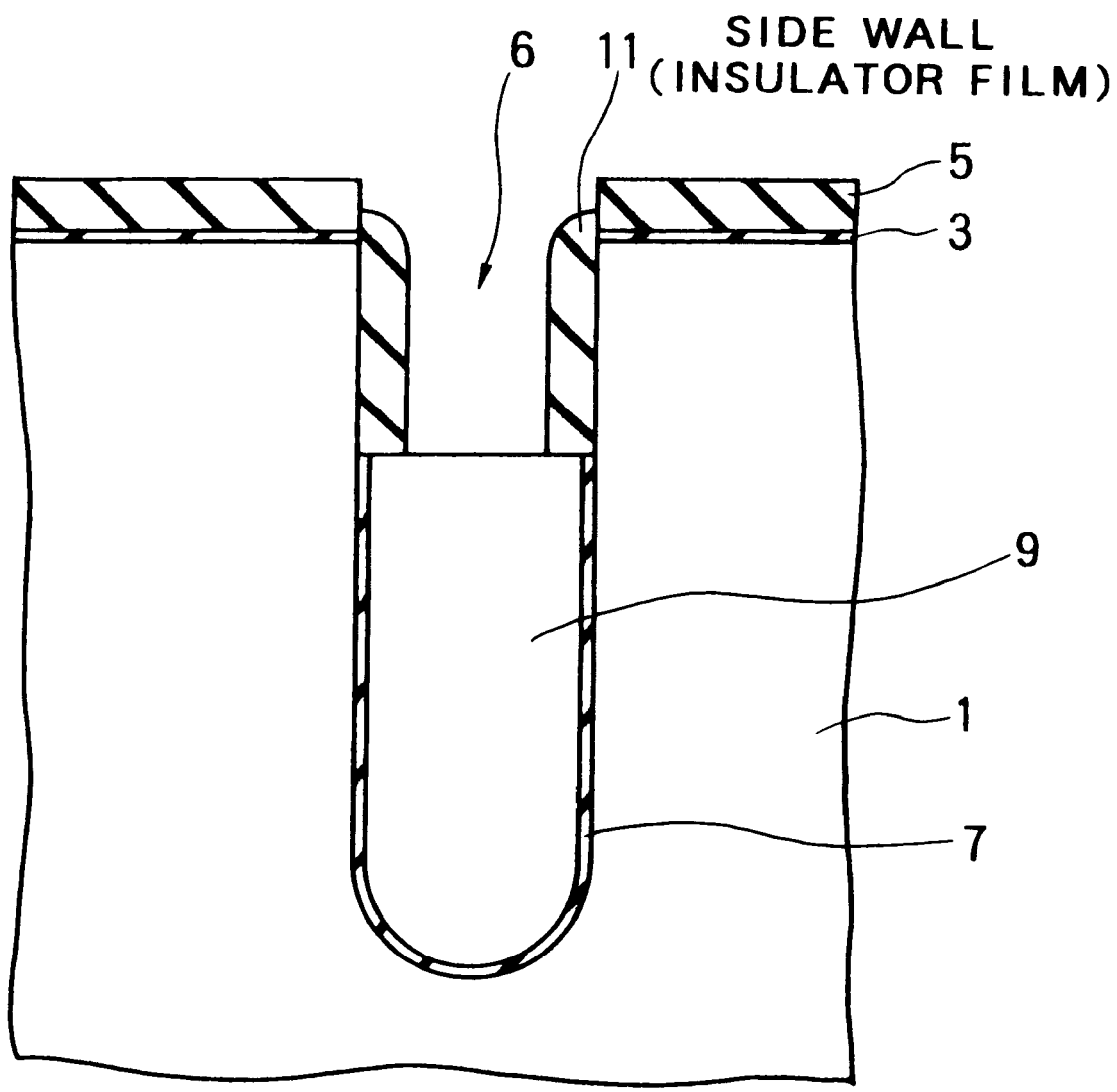
FIG. 4 is a sectional view showing a step in the second preferred embodiment of a method for producing a semiconductor device according to the present invention.

Then, the amorphous silicon film 8 is etched and removed by a depth of 1 $\mu$m from the surface of the silicon substrate 1 to form a storage node 9 of the amorphous silicon in the trench 6 (see FIG. 4). Subsequently, after removing the exposed capacitor insulator film 7, a silicon oxide film is deposited on the whole surface of the substrate, and the anisotropic etching is carried out to form a side wall 11 of the silicon oxide film on the side surface of the trench 6 (see FIG. 4).

Figure 5:
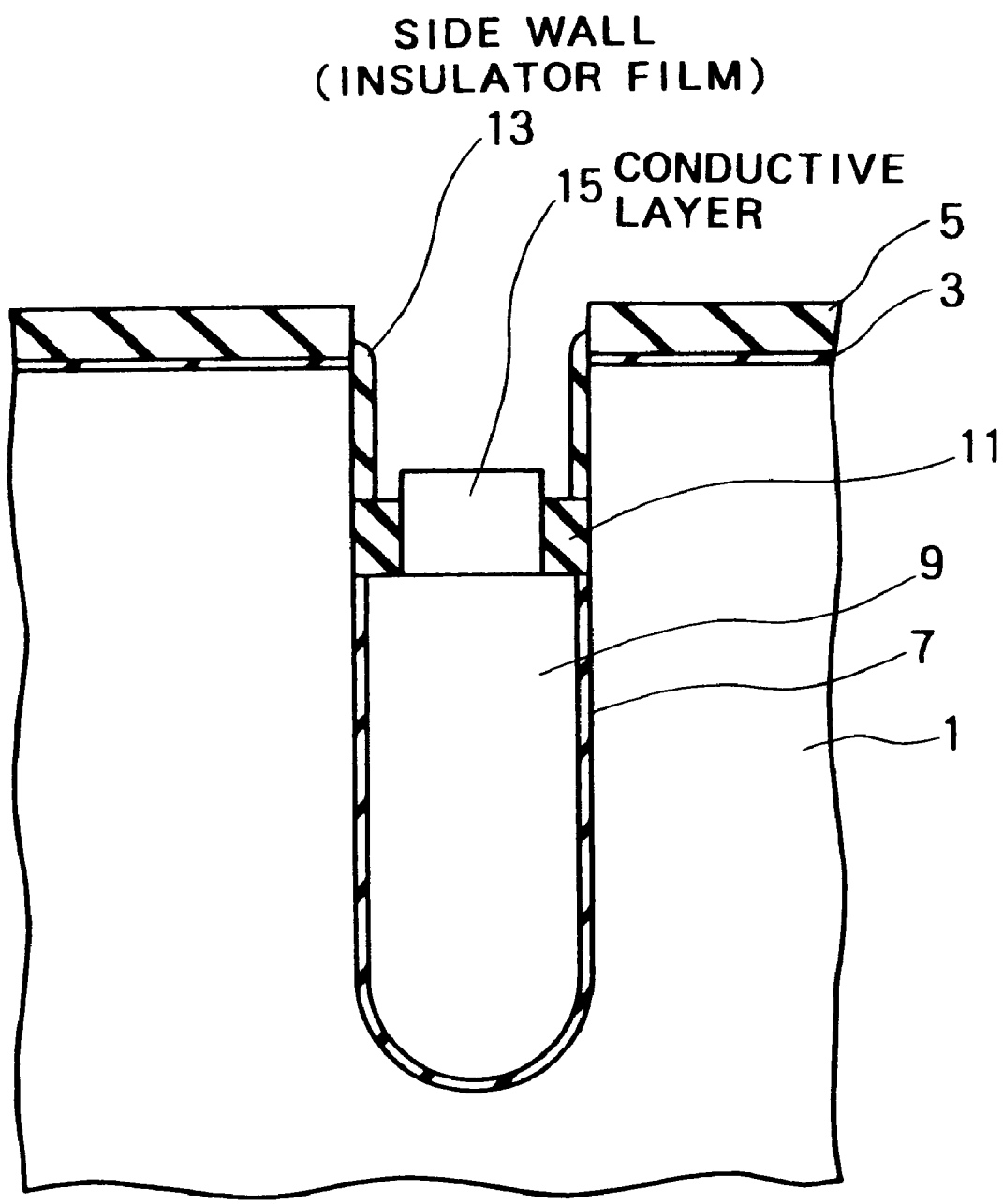
FIG. 5 is a sectional view showing a step in the second preferred embodiment of a method for producing a semiconductor device according to the present invention.

Then, after an amorphous silicon, to which an n-type impurity is added, is deposited on the whole surface of the substrate so as to bury the trench 6, the amorphous silicon is etched back to form a conductive layer 15 on the storage node 9 (see FIG. 5). Subsequently, the upper portion of the insulator film 11 is removed with, e.g., an HF solution, so that the side wall 11 is lower than the conductive layer 15 (see FIG. 5). Then, a silicon oxide film is deposited on the whole surface of the substrate, and the anisotropic etching of the silicon oxide film is carried out to form a side wall (insulator film) 13 of the silicon oxide film which is thinner than the side wall 11 (see FIG. 5).

Figure 6:
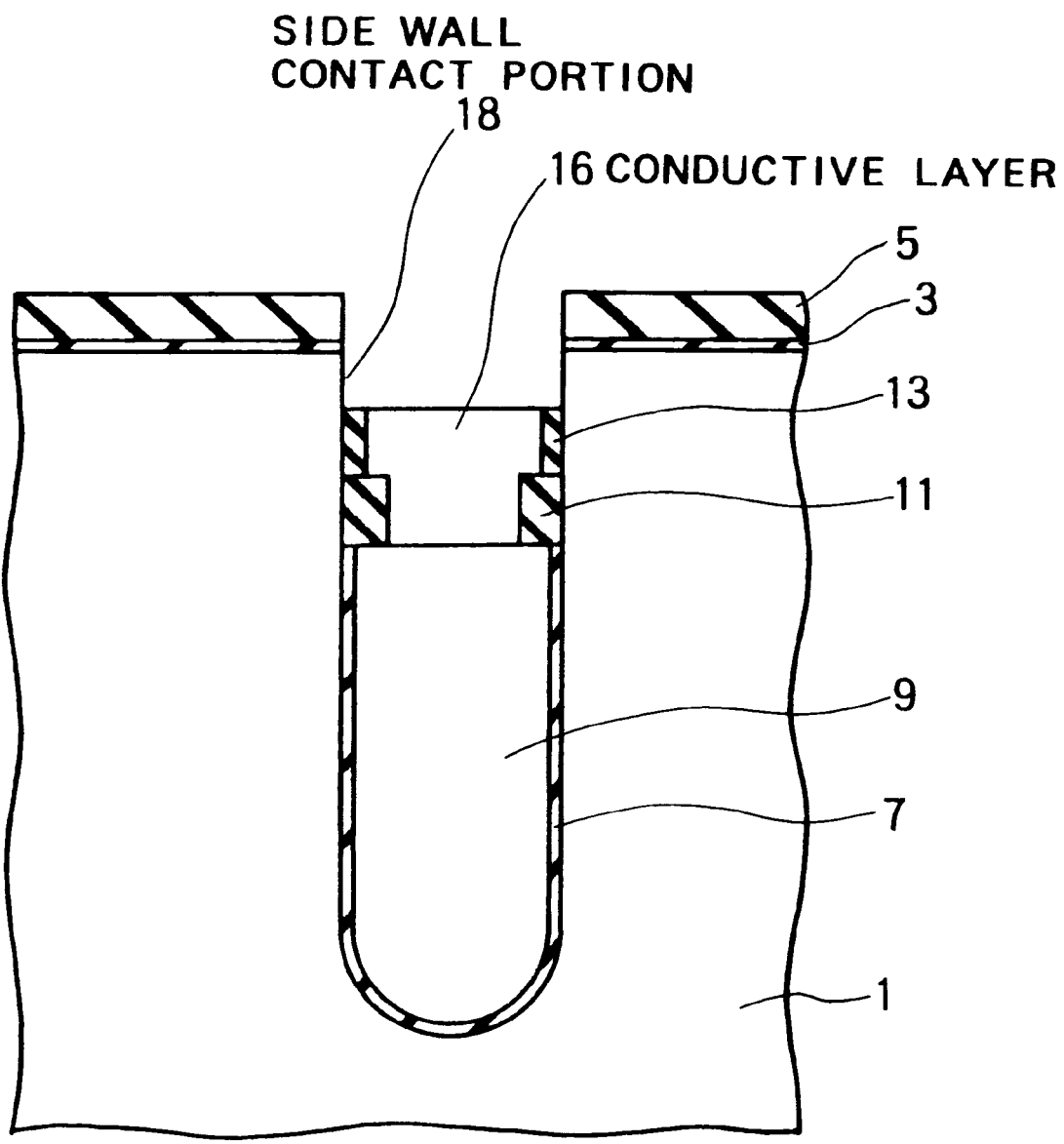
FIG. 6 is a sectional view showing a step in the second preferred embodiment of a method for producing a semiconductor device according to the present invention.
Figure 7:
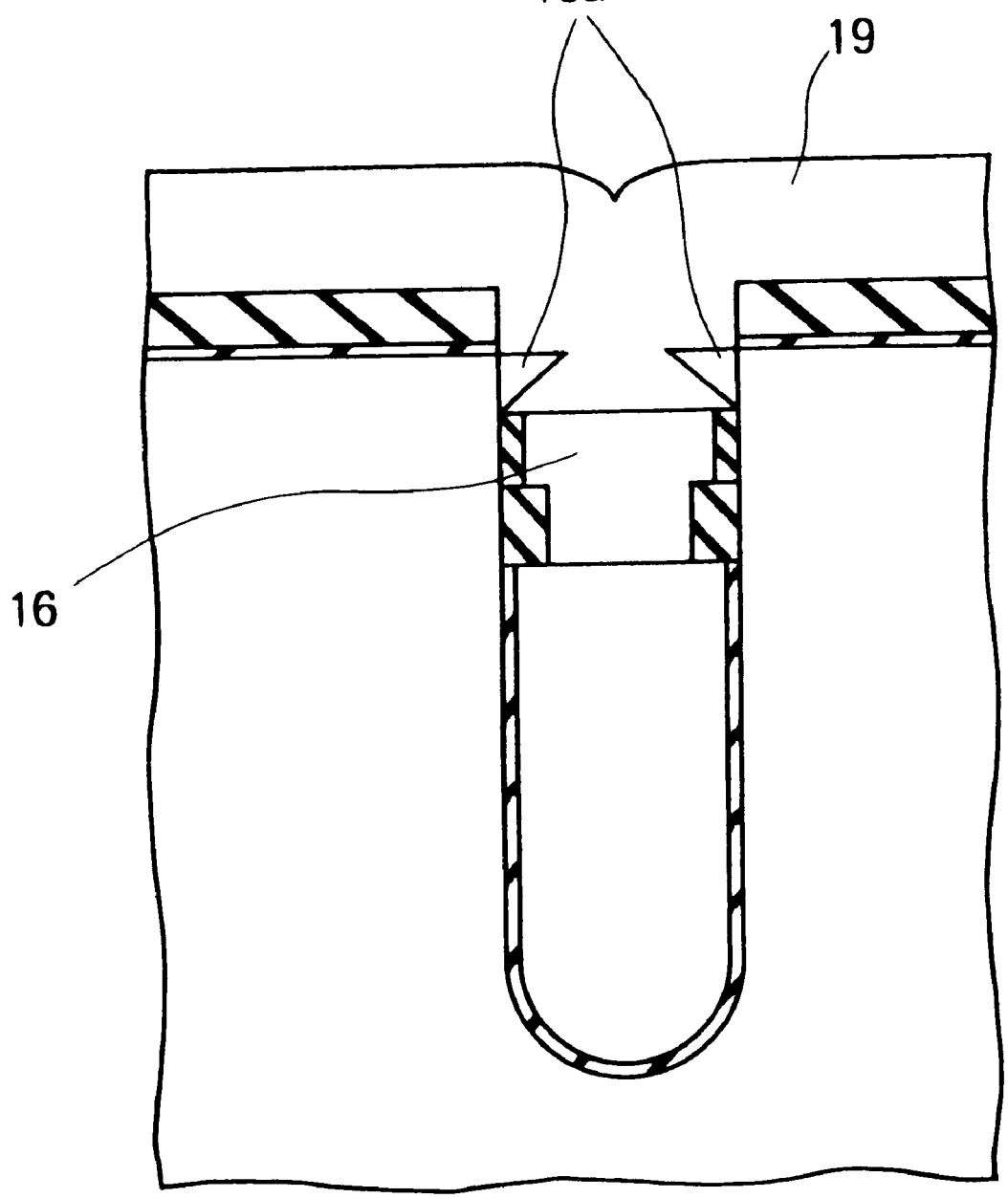
FIG. 7 is a sectional view showing a step in the second preferred embodiment of a method for producing a semiconductor device according to the present invention.
Figure 8:
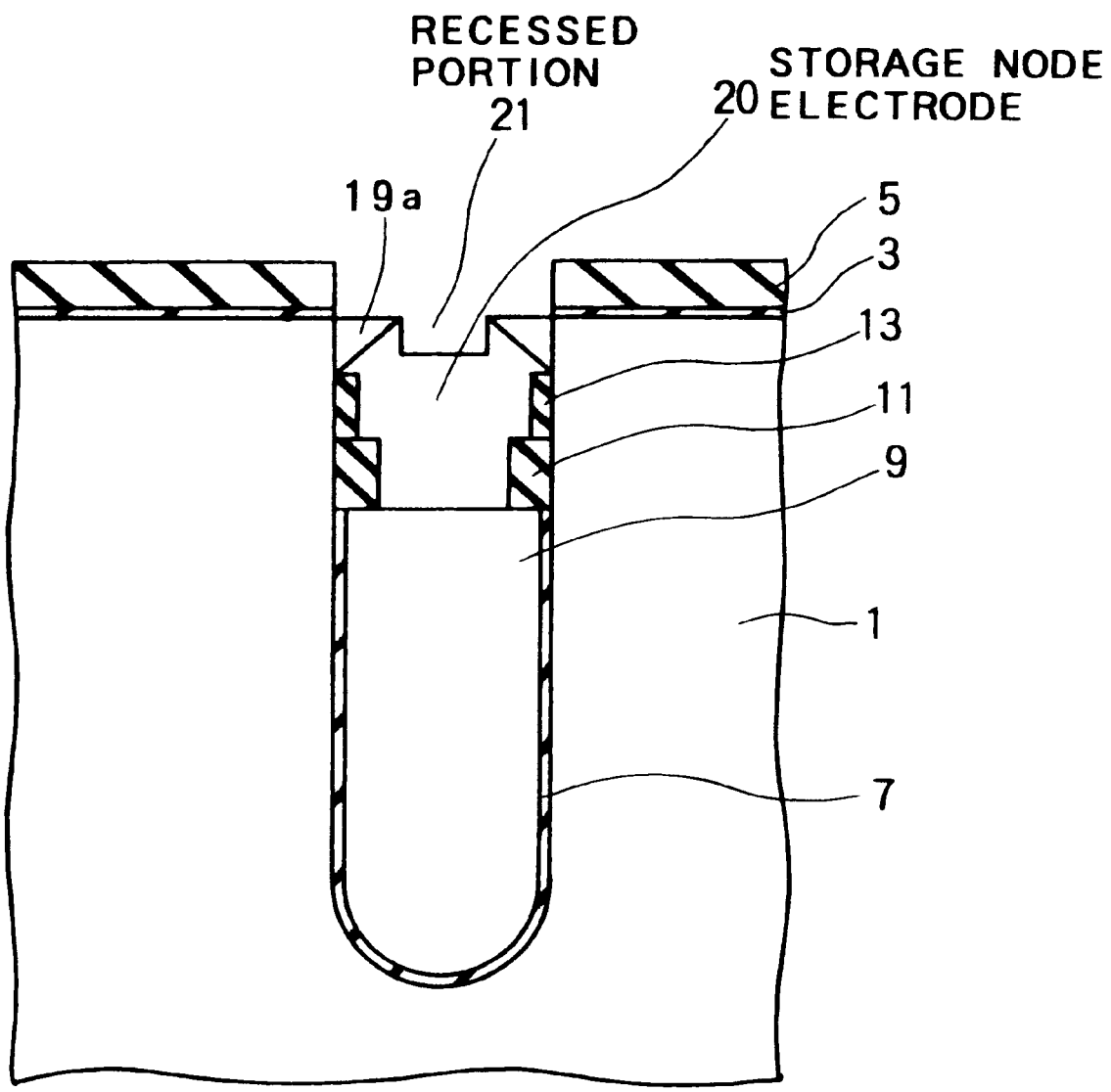
FIG. 8 is a sectional view showing a step in the second preferred embodiment of a method for producing a semiconductor device according to the present invention.

Then, after an amorphous silicon, to which an n-type impurity is added, is deposited on the whole surface of the substrate so as to bury the trench 6, the amorphous silicon is etched back to form a conductive layer 16 (see FIG. 6). This conductive layer 16 includes the conductive layer 15 shown in FIG. 5. Subsequently, the upper portion of the insulator film 13 is removed with, e.g., an HF solution, to form a side wall contact portion 18 on the side portion of the upper portion of the trench 6 (see FIG. 6). Since this insulator film 13 is thin, the time required to peel off the insulator film 13 during the etching is shorter than that for the insulator film 11, and the over etching amount is less than that for the insulator film 11. Thus, it is possible to stabilize the control of the depth of the side wall contact portion 18, and it is possible to inhibit the side wall contact portion 18 from being etched in the depth direction, so that it is possible to suppress a leak current.

Then, the substrate 1 is put in a chamber in an atmosphere of a reduction gas (e.g., SiH$_4$ or H$_2$) to remove natural oxide films from the surfaces of the conductive layer 16 and the side wall contact portion 18. Subsequently, an amorphous silicon film 19 is deposited while the substrate is put in the same chamber (see FIG. 7). At this time, the silicon substrate 1 exposed to the side wall contact portion 18 serves as a nucleus to allow a mono-crystalline silicon to grow from the side wall contact portion 18 to form a mono-crystalline silicon region 19a(see FIG. 7).

Then, the amorphous silicon film 19 is etched on etching conditions, which can take an etch selectivity with the mono-crystalline silicon, to form a storage node electrode 20. The storage node electrode 20 comprises an amorphous silicon layer 16, an amorphous silicon film 19 and a monocrystalline silicon region 19a. In the upper surface of the amorphous silicon region, a recessed portion 21 is formed (see FIG. 8).

Figure 9:
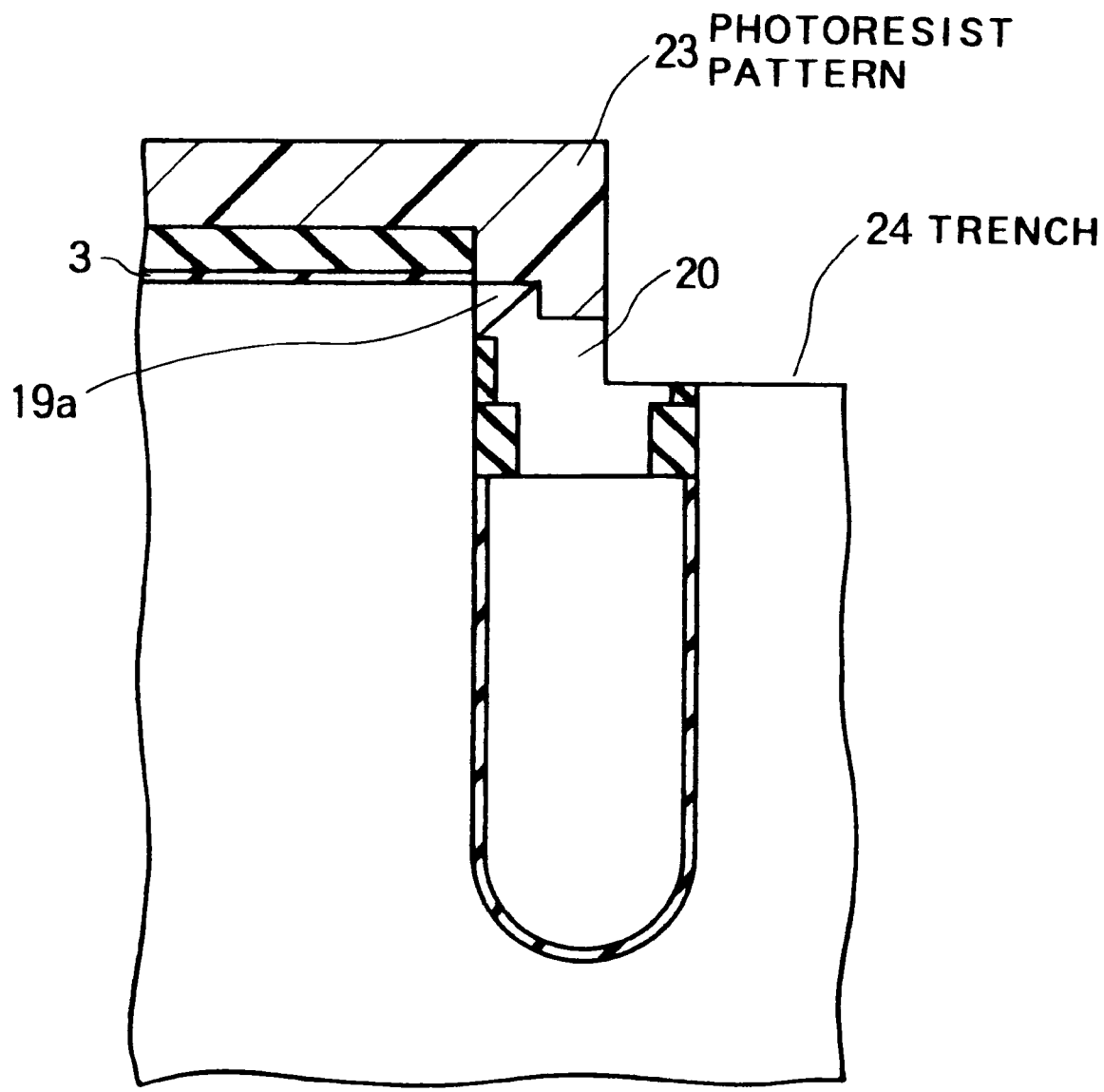
FIG. 9 is a sectional view showing a step in the second preferred embodiment of a method for producing a semiconductor device according to the present invention.
Figure 10:
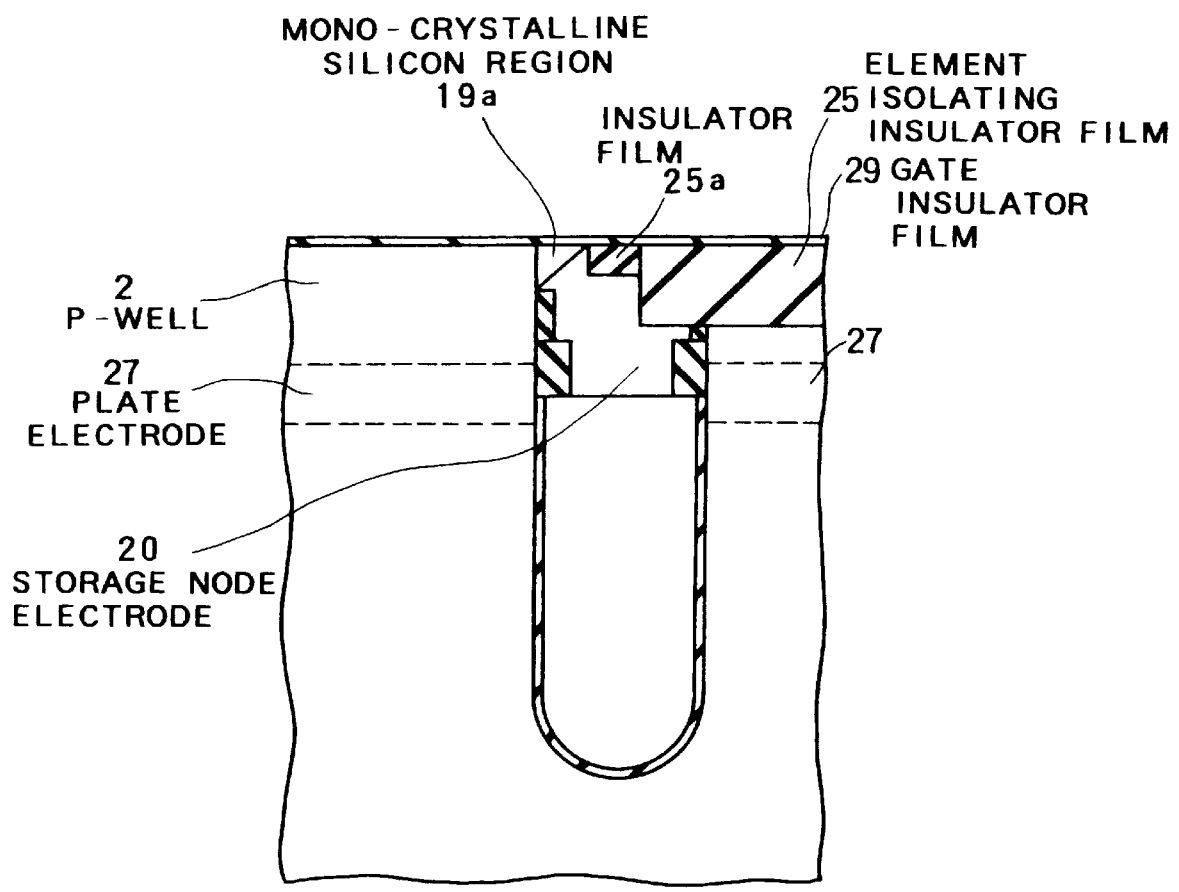
FIG. 10 is a sectional view showing a step in the second preferred embodiment of a method for producing a semiconductor device according to the present invention.

Then, as shown in FIG. 9, a photoresist pattern 23 is formed. Using the photoresist pattern as a mask, the anisotropic etching is carried out to form a trench 24, which is shallower than the trench 6, in an element isolation forming region. Subsequently, after the photoresist pattern 23 is removed, the recessed portion 21 and the trench 24 are buried with an insulator film, e.g., a silicon oxide film, to form an isolating insulator film 25a and an element isolating insulator film 25 as sown in FIG. 10. Then, after the silicon nitride film 5 shown in FIG. 9 is peeled off, an n-type impurity, e.g., phosphorus, is ion-implanted in the whole surface of the substrate on predetermined conditions to form a diffusion layer 27 serving as a plate electrode (see FIG. 10). Thus, the region of the silicon substrate 1 over the diffusion layer 27 serves as a p-well 2. Subsequently, after the oxide film 3 (see FIG. 9) is peeled off, a gate insulator film 29 is formed on the whole surface of the substrate as shown in FIG. 10.

Figure 11:
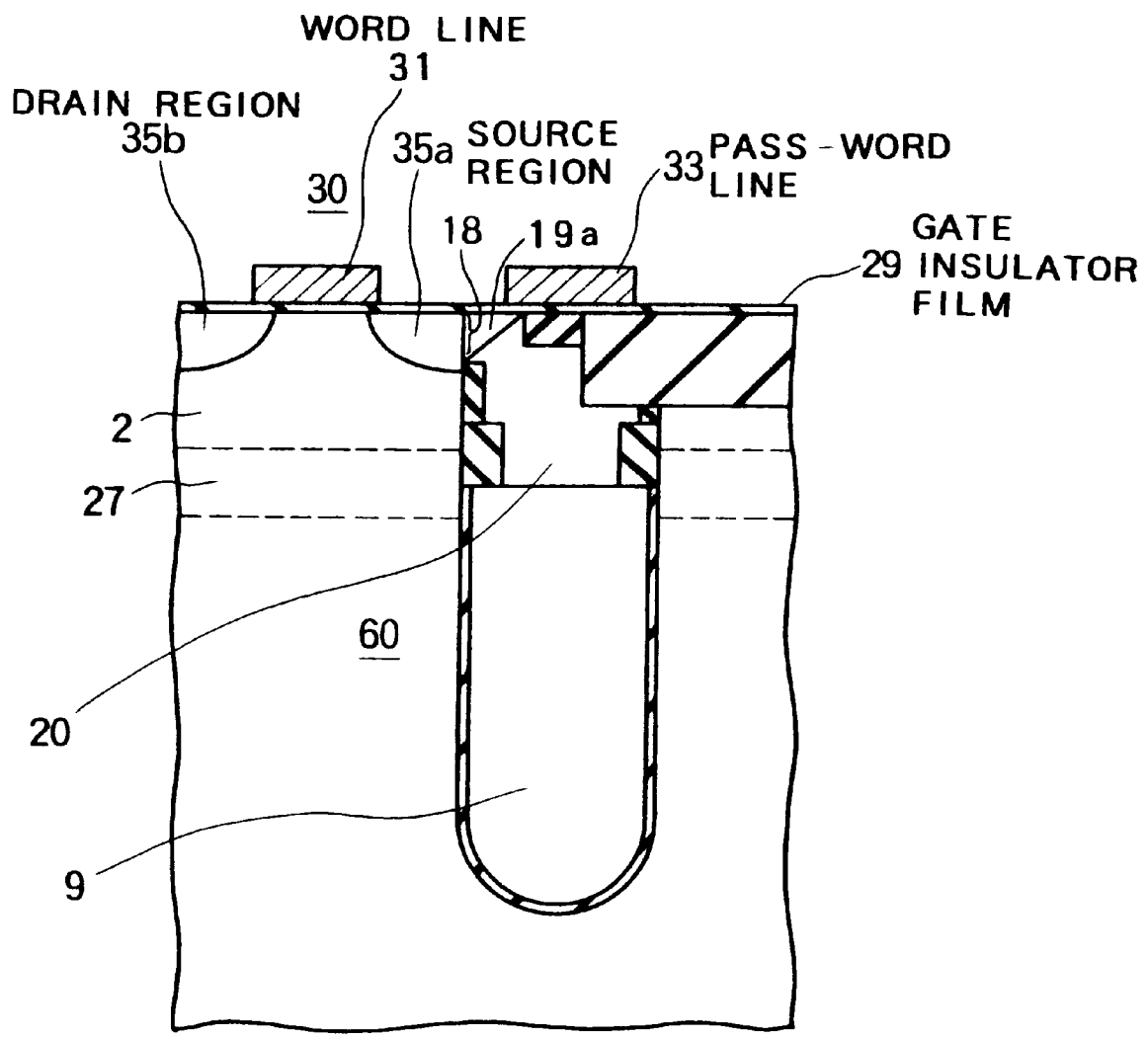
FIG. 11 is a sectional view showing a step in the second preferred embodiment of a method for producing a semiconductor device according to the present invention.

Then, a gate electrode material, e.g., a polycrystalline silicon film, is deposited on the whole surface of the substrate, and this polycrystalline silicon film is patterned to form a word line 31 and a pass-word line 33 which serve as gate electrodes of the cell transistor 30 (see FIG. 11). Then, using these gate electrodes as masks, the ion implantation of an n-type impurity is carried out on predetermined conditions to form a source region 35a and a drain region 35b. At this time, the depth of the source region 35a is preferably greater than that of the side wall contact portion 18.

Furthermore, the amorphous silicon forming the storage node 9 and the storage node electrode 20 is changed to a polycrystalline silicon during the thermal steps of forming the cell transistor 30 and the trench capacitor 60 (e.g., the step of depositing the element isolating insulator film 25, the step of activating the source-drain region and so forth).

The semiconductor storage device produced by the second preferred embodiment of a producing method according to the present invention has the same advantageous effects as those in the first preferred embodiment.

Referring to FIGS. 12 through 20, the third preferred embodiment of the present invention will be described below. In this third preferred embodiment, there is provided a method for producing the first preferred embodiment of a semiconductor storage device, according to the present invention, which is shown in FIG. 1. FIGS. 12 through 20 show steps of the producing method.

Figure 12:
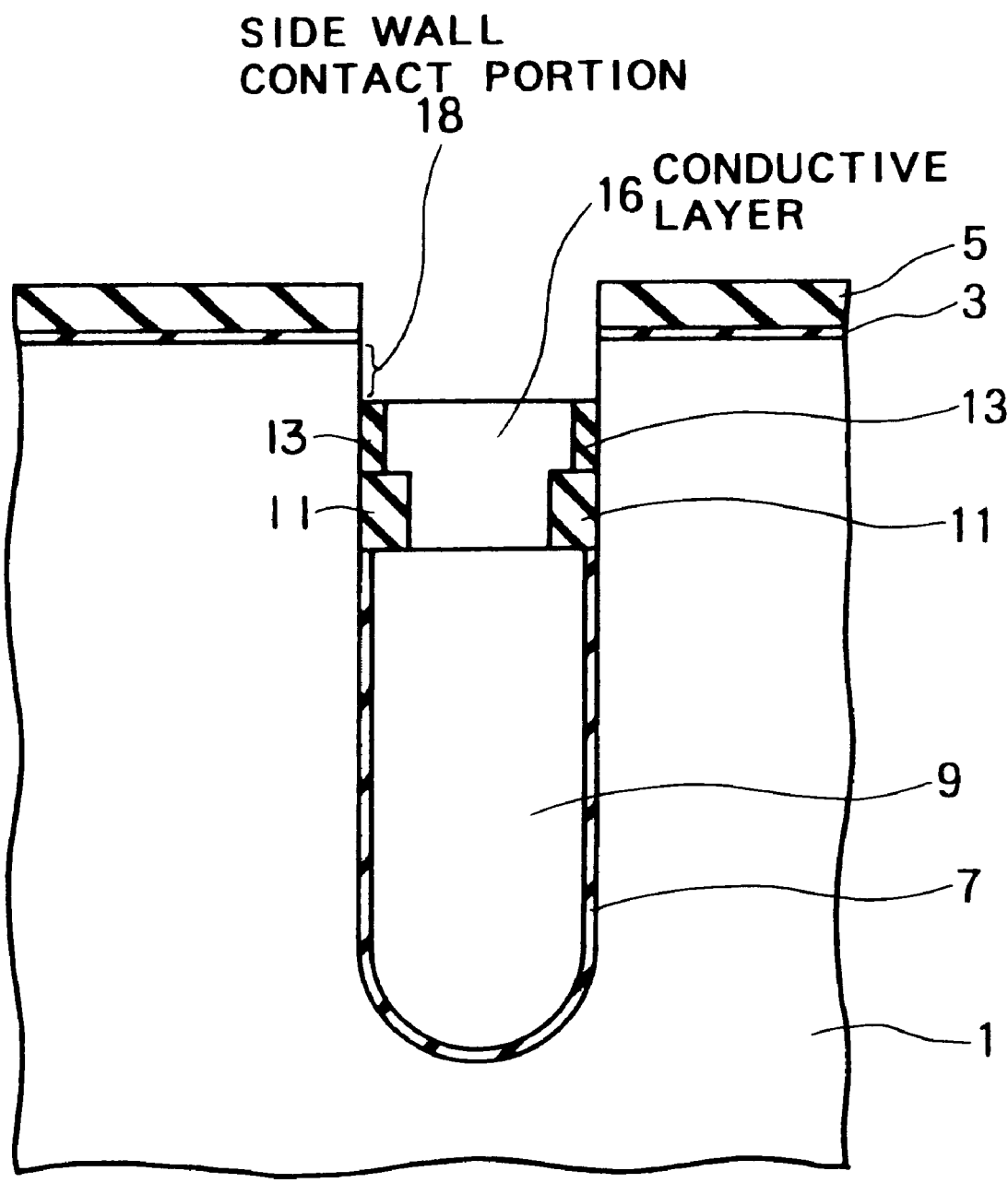
FIG. 12 is a sectional view showing a step in the third preferred embodiment of a method for producing a semiconductor device according to the present invention.
Figure 13:
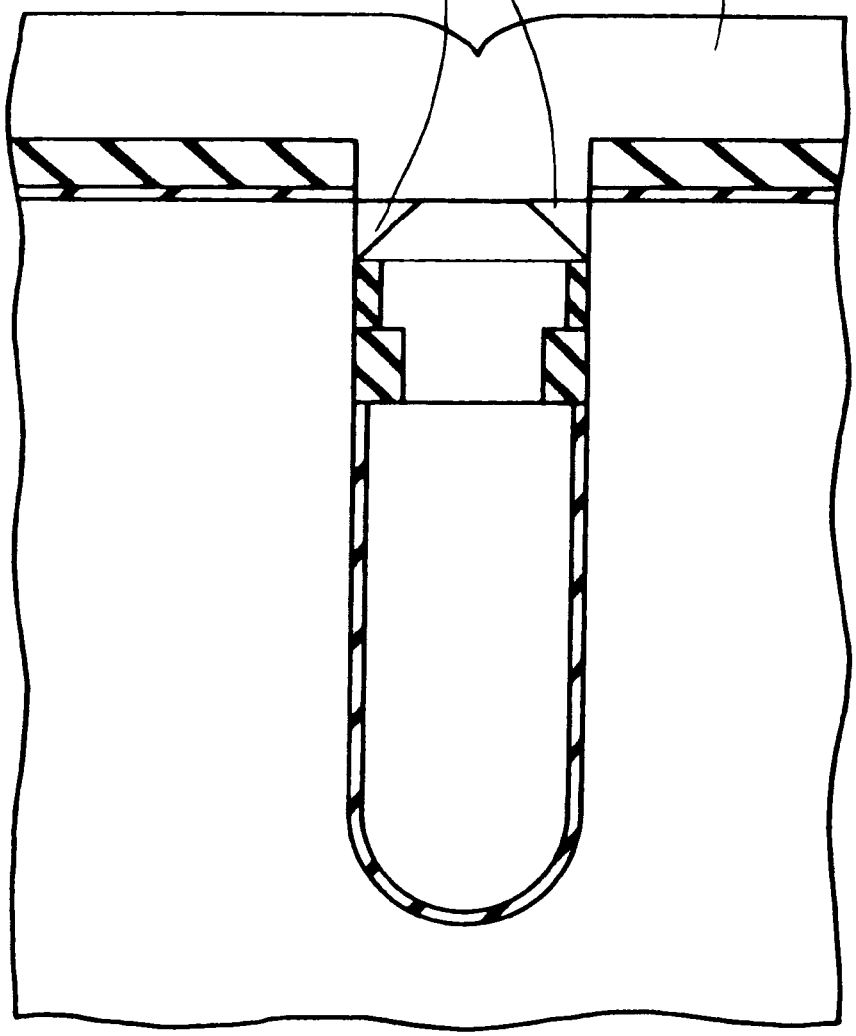
FIG. 13 is a sectional view showing a step in the third preferred embodiment of a method for producing a semiconductor device according to the present invention.

First, the same steps as those shown in FIGS. 2 through 6 are carried out to form a conductive layer 16 and a side wall contact portion 18 (see FIG. 12).

Then, the substrate 1 is put in a chamber in an atmosphere of a reduction gas (e.g., SiH$_4$ or H$_2$) to remove natural oxide films from the surfaces of the conductive layer 16 and the side wall contact portion 18. Subsequently, an amorphous silicon film 19 is deposited while the substrate is put in the same chamber (see FIG. 13). At this time, the silicon substrate 1 exposed to the side wall contact portion 18 serves as a nucleus to allow a mono-crystalline silicon to grow from the side wall contact portion 18 to form a mono-crystalline silicon region 19a(see FIG. 13).

Figure 14:
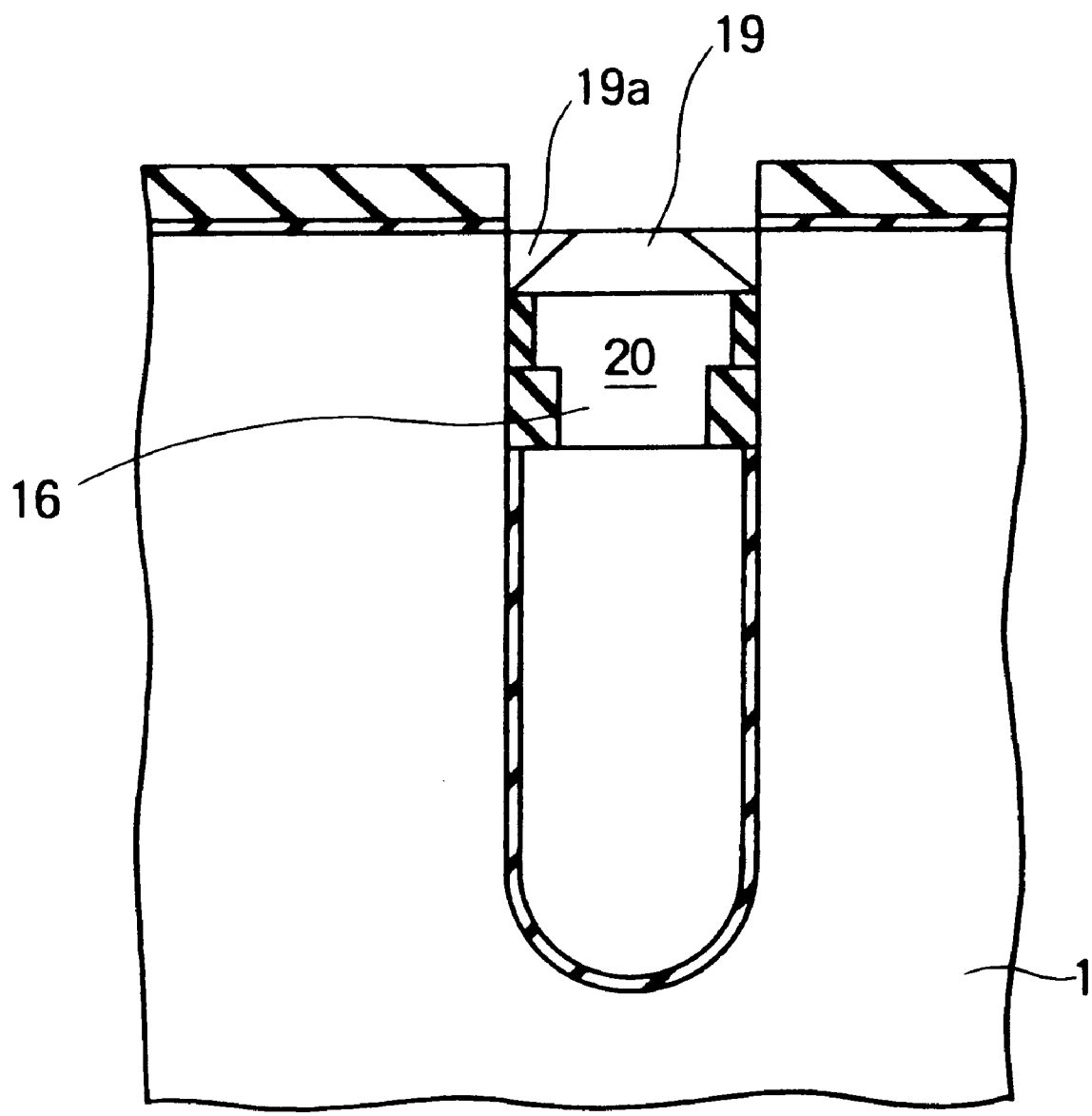
FIG. 14 is a sectional view showing a step in the third preferred embodiment of a method for producing a semiconductor device according to the present invention.

Then, the amorphous silicon film 19 is etched back until the amorphous silicon film 19 is level with the upper surface of the silicon substrate 1 (see FIG. 14). At this time, as shown in FIG. 14, the amorphous silicon film 19 is level with the mono-crystalline silicon region 19a. Then, the conductive layer 16, the amorphous silicon film 19 and the monocrystalline silicon region 19aare associated with each other to form a storage node electrode 20.

Figure 15:
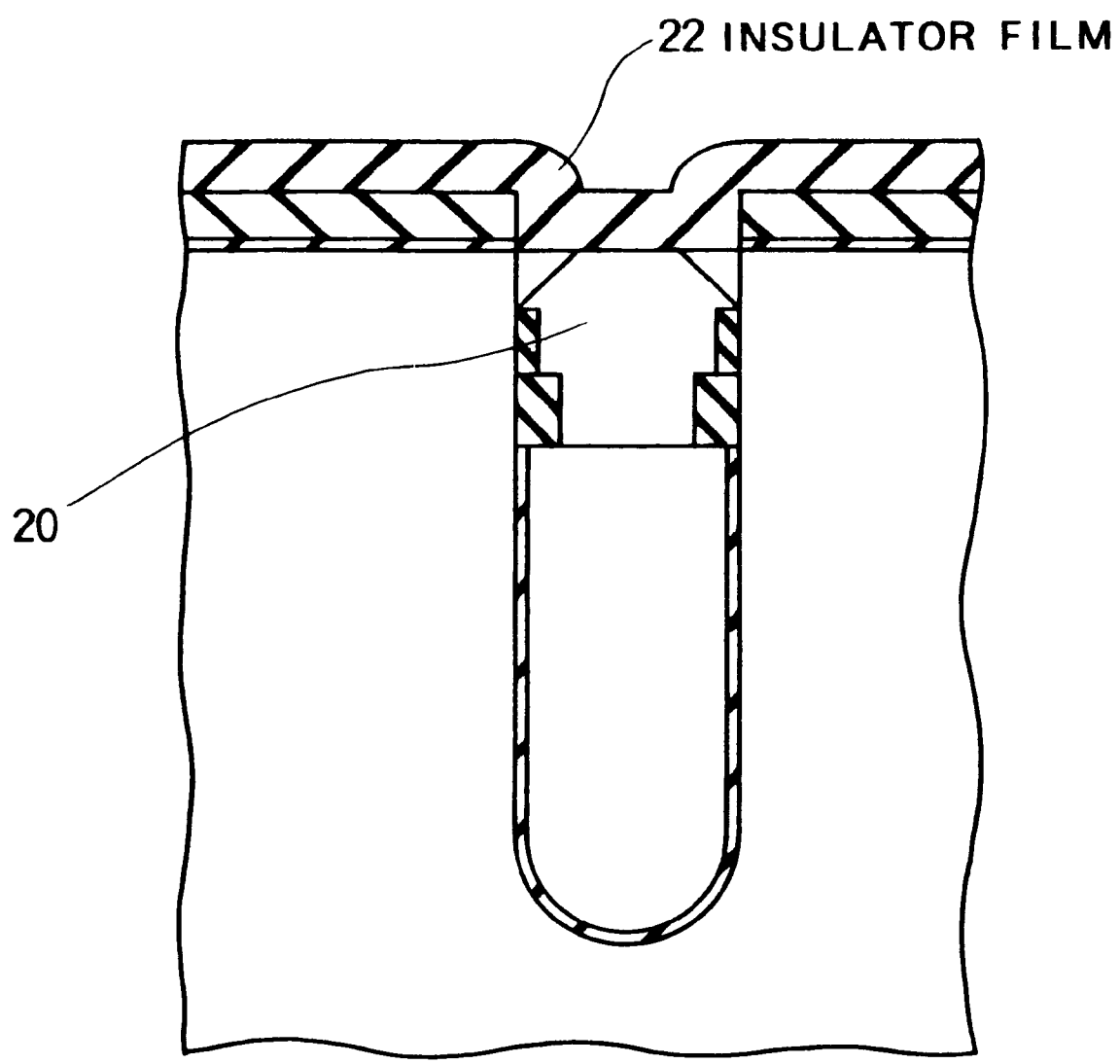
FIG. 15 is a sectional view showing a step in the third preferred embodiment of a method for producing a semiconductor device according to the present invention.
Figure 16:
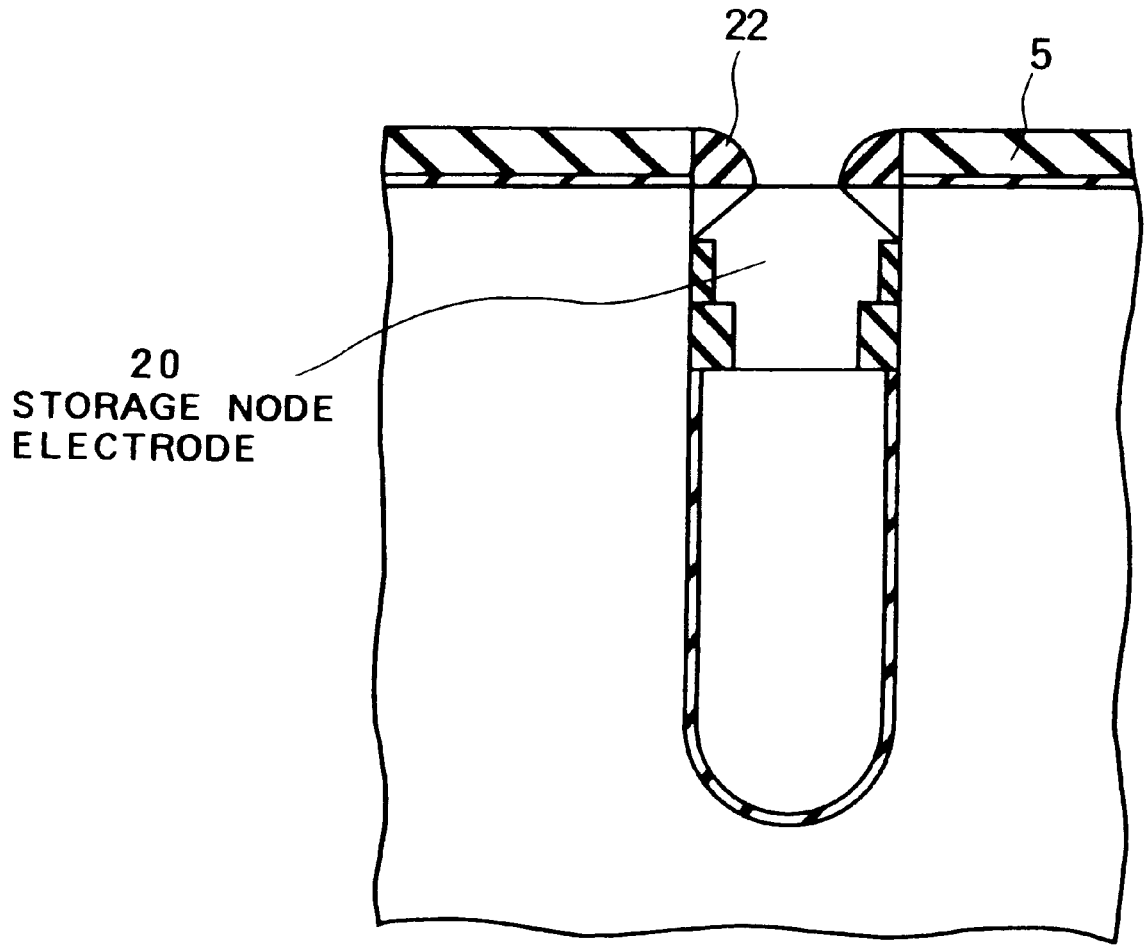
FIG. 16 is a sectional view showing a step in the third preferred embodiment of a method for producing a semiconductor device according to the present invention.

Then, after an insulator film 22 of, e., a silicon oxide film, is deposited on the whole surface of the substrate as shown in FIG. 15, the insulator film 22 is etched by the anisotropic etching to leave the insulator film 22 only at the side portion of the silicon nitride film 5 (see FIG. 16).

Figure 17:
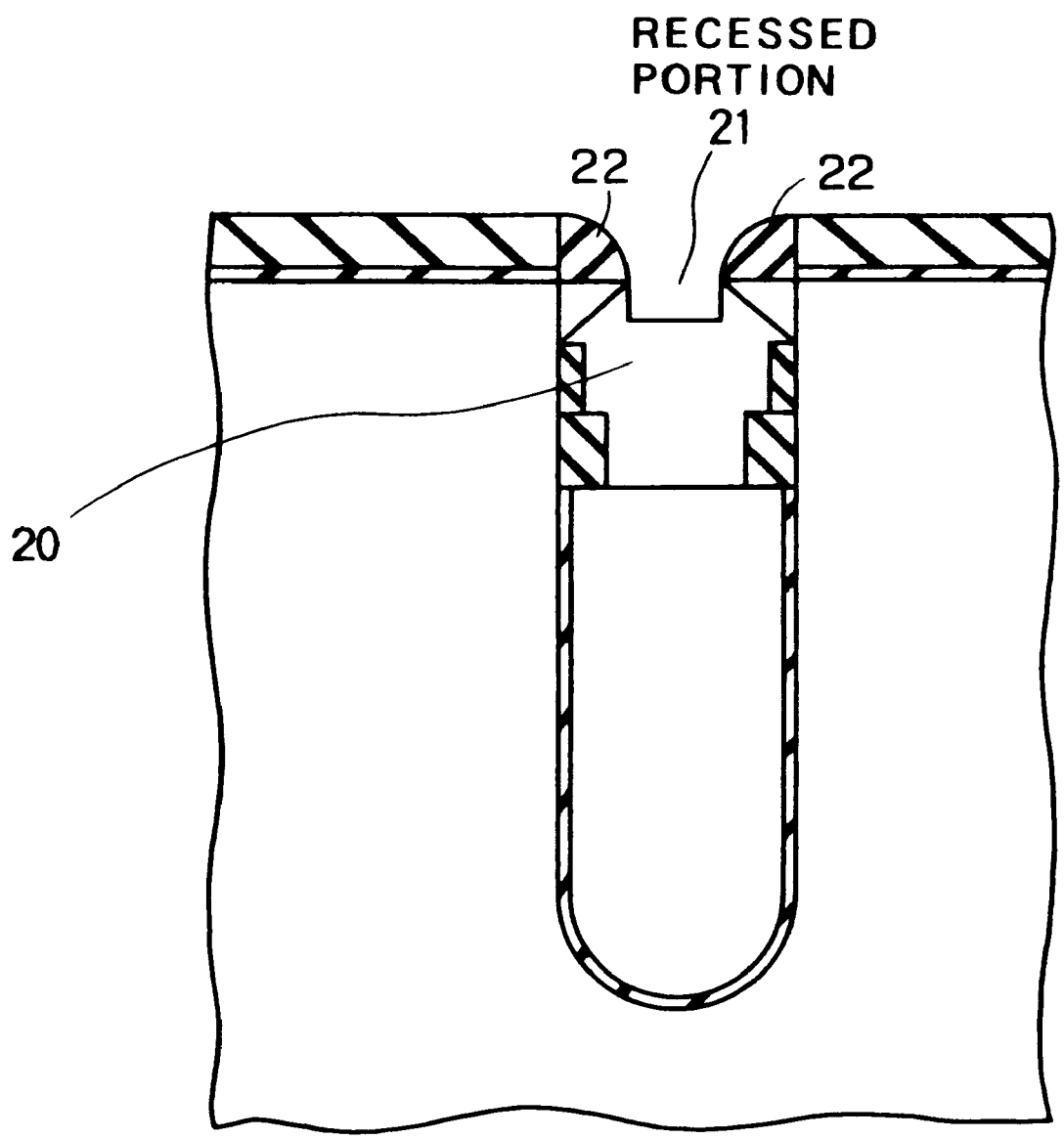
FIG. 17 is a sectional view showing a step in the third preferred embodiment of a method for producing a semiconductor device according to the present invention.

Then, using the insulator film 22 as a mask, the amorphous silicon region of the storage node electrode 20 is etched by the anisotropic etching to form a recessed portion 21 in the storage node electrode 20 (see FIG. 17).

Figure 18:
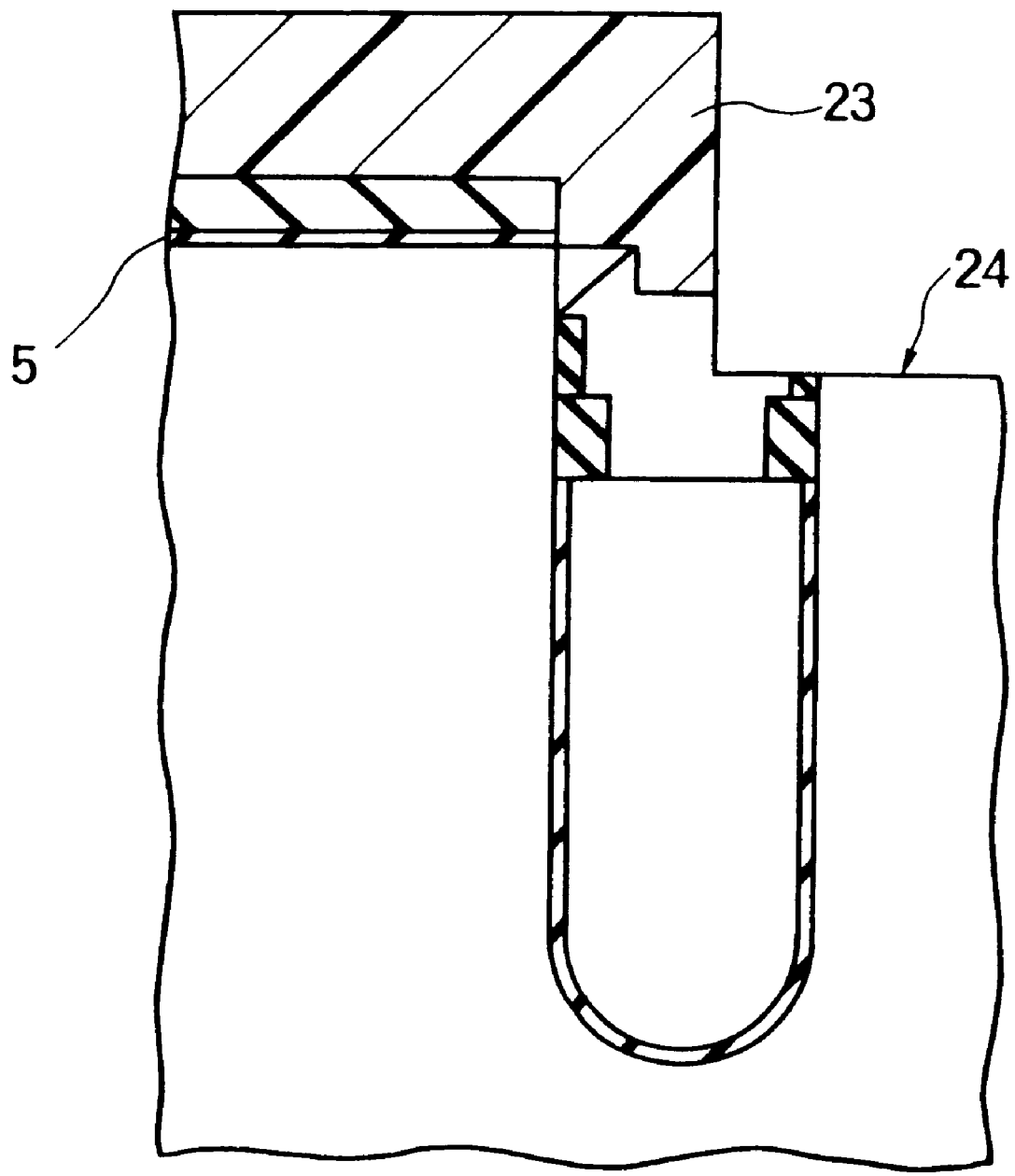
FIG. 18 is a sectional view showing a step in the third preferred embodiment of a method for producing a semiconductor device according to the present invention.

Then, after the insulator film 21 is removed with, e.g., an HF solution, a photoresist pattern 23 is formed as shown in FIG. 18, and using the photoresist pattern 23 as a mask, the anisotropic etching is carried out to form a trench 24, which is shallower than the trench 6.

Figure 19:
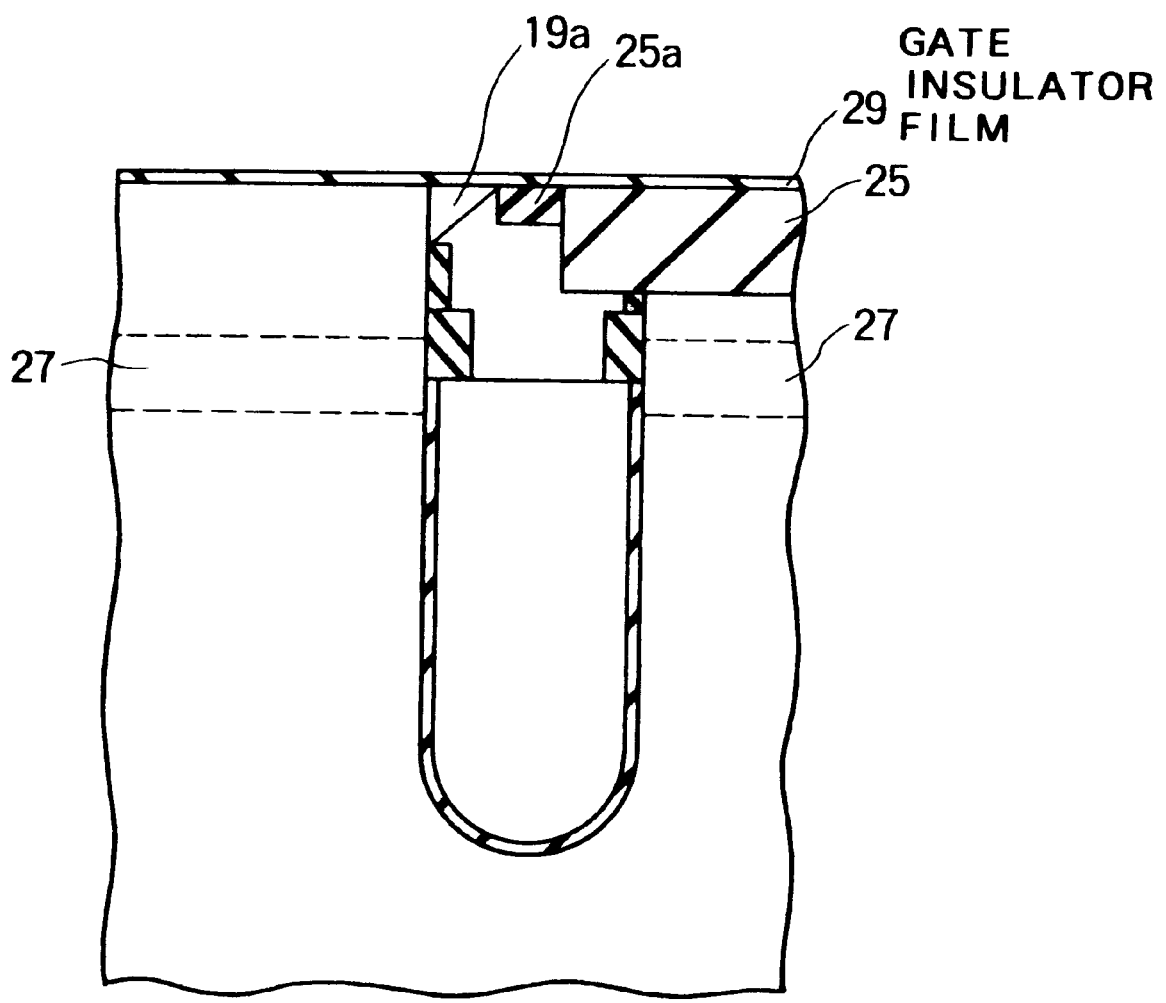
FIG. 19 is a sectional view showing a step in the third preferred embodiment of a method for producing a semiconductor device according to the present invention.

Subsequently, after the photoresist pattern 23 is removed, the recessed portion 21 and the trench 24 are buried with an insulator film, e.g., a silicon oxide film, to form an isolating insulator film 25a and an element isolating insulator film 25 as shown in FIG. 19. Then, after the silicon nitride film shown in FIG. 18 is peeled off, an n-type impurity, e.g., phosphorus, is ion-implanted in the whole surface of the substrate on predetermined conditions to form a diffusion layer 27 serving as a plate electrode (see FIG. 19). Thus, the region of the silicon substrate 1 over the diffusion layer 27 serves as a p-well 2. Subsequently, after the oxide film 3 (see FIG. 18) is peeled off, a gate insulator film 29 is formed on the whole surface of the substrate as shown in FIG. 19.

Figure 20:
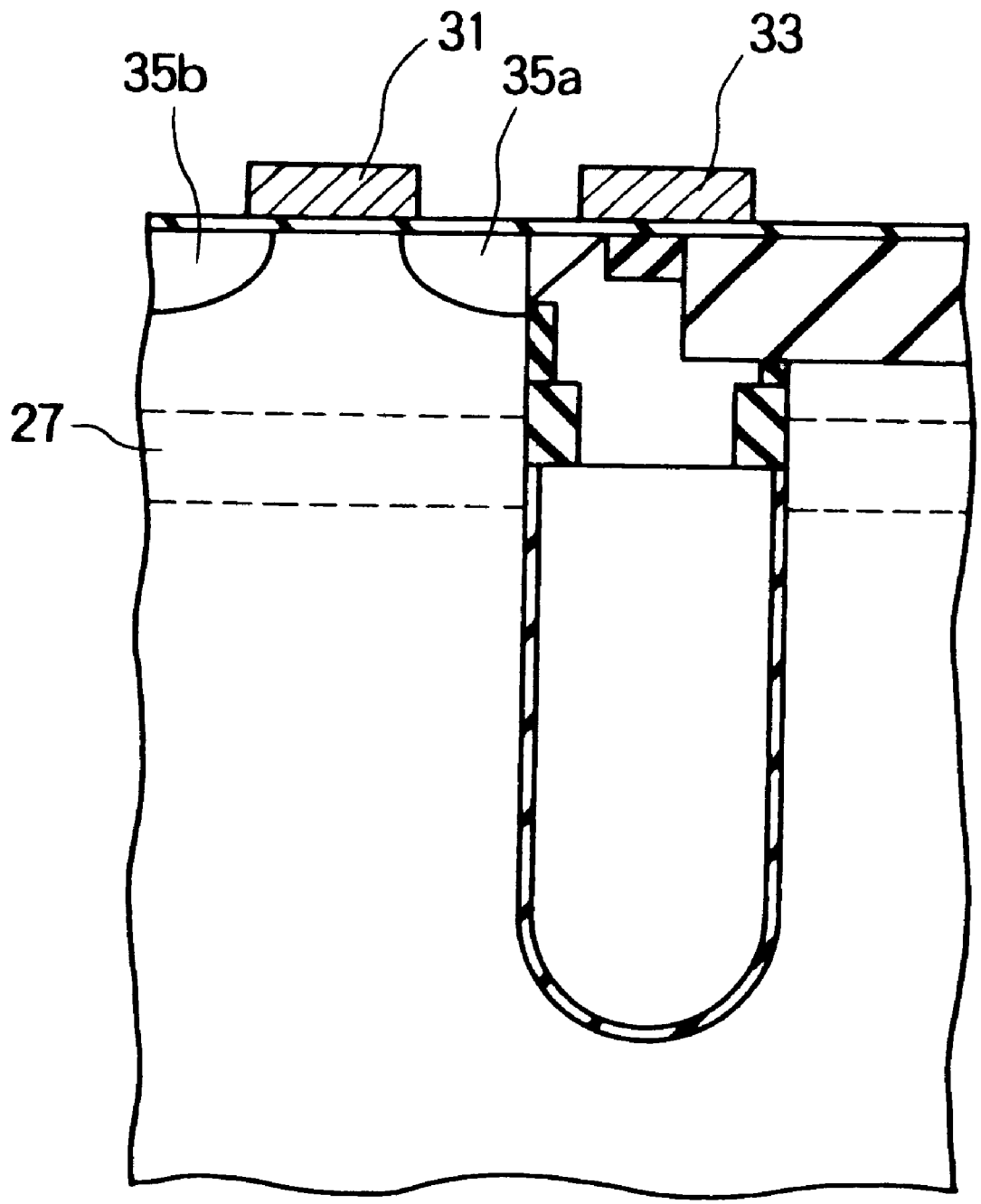
FIG. 20 is a sectional view showing a step in the third preferred embodiment of a method for producing a semiconductor device according to the present invention.
Figure 21:
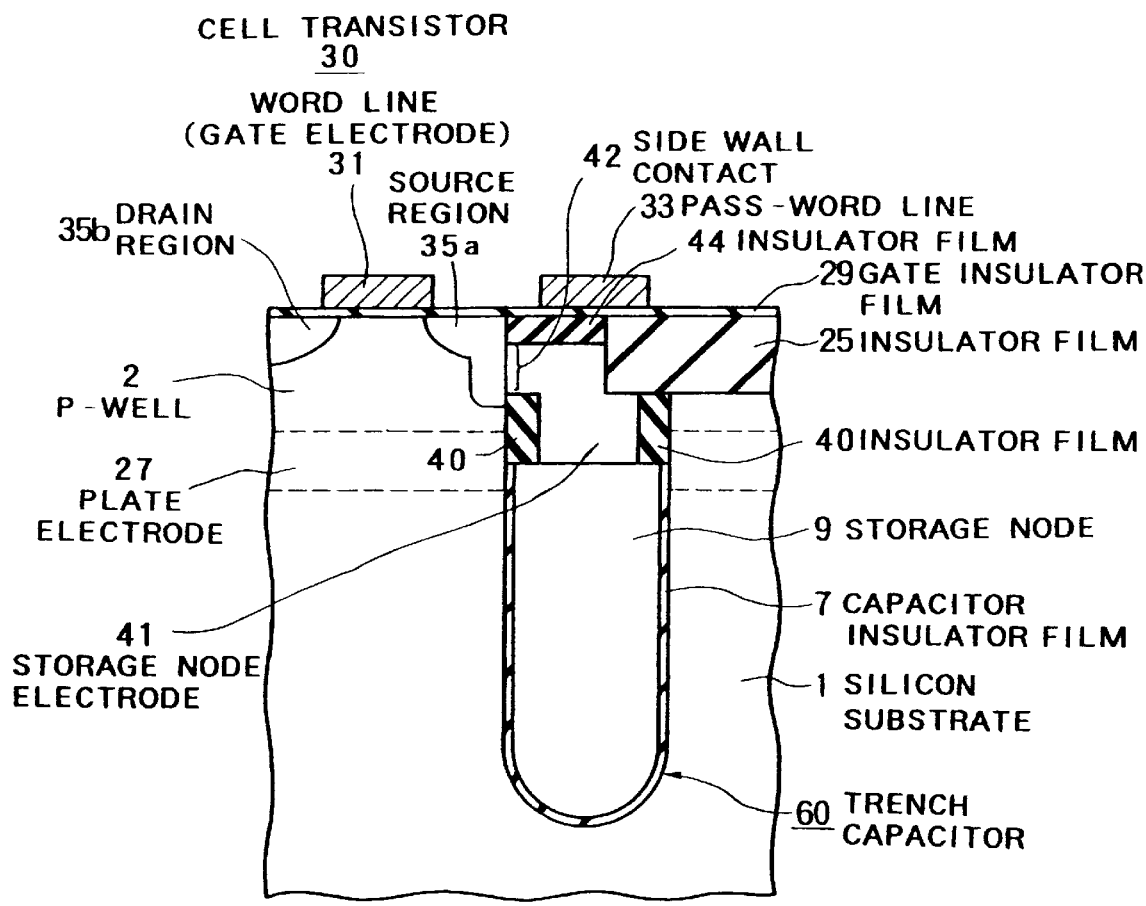
FIG. 21 is a sectional view of a conventional semiconductor storage device.

Then, a gate electrode material, e.g., a polycrystalline silicon film, is deposited on the whole surface of the substrate, and the polycrystalline silicon film is patterned to form a word line 31 and a pass-word line 33 which serve as gate electrodes of the cell transistor 30 (see FIG. 20). Then, using these gate electrodes as masks, the ion implantation of an n-type impurity is carried out on predetermined conditions to form source electrodes 35a and 35b. At this time, the depth of the source region 35a is preferably greater than that of the side wall contact portion 18.

Furthermore, the amorphous silicon forming the storage node 9 and the storage node electrode 20 is changed to a polycrystalline silicon during the thermal steps of forming the cell transistor 30 and the trench capacitor 60 (e.g., the step of depositing the element isolating insulator film 25, the step of activating the source-drain region and so forth).

The third preferred embodiment of a producing method according to the present invention has the same advantageous effects as those in the second preferred embodiment.

While the amorphous silicon has been used for forming the storage node 9 and the conductive layers 15 and 16 in the second and third preferred embodiments, another conductive material, e.g., a polycrystalline silicon, into which an impurity is doped, or a metal, may be used.

In addition, while the side walls 11 and 13 having different thickness have been formed in the second and third preferred embodiments, the side walls 11 and 13 may have the same thickness. In this case, it is not required to form the side wall 13 and the conductive layer 15.

Furthermore, in the second and third preferred embodiments, the n-type impurity may be changed to a p-type impurity to form the trench capacitor and the cell transistor. In this case, an n-type silicon substrate is used as the silicon substrate.

Figure 24:
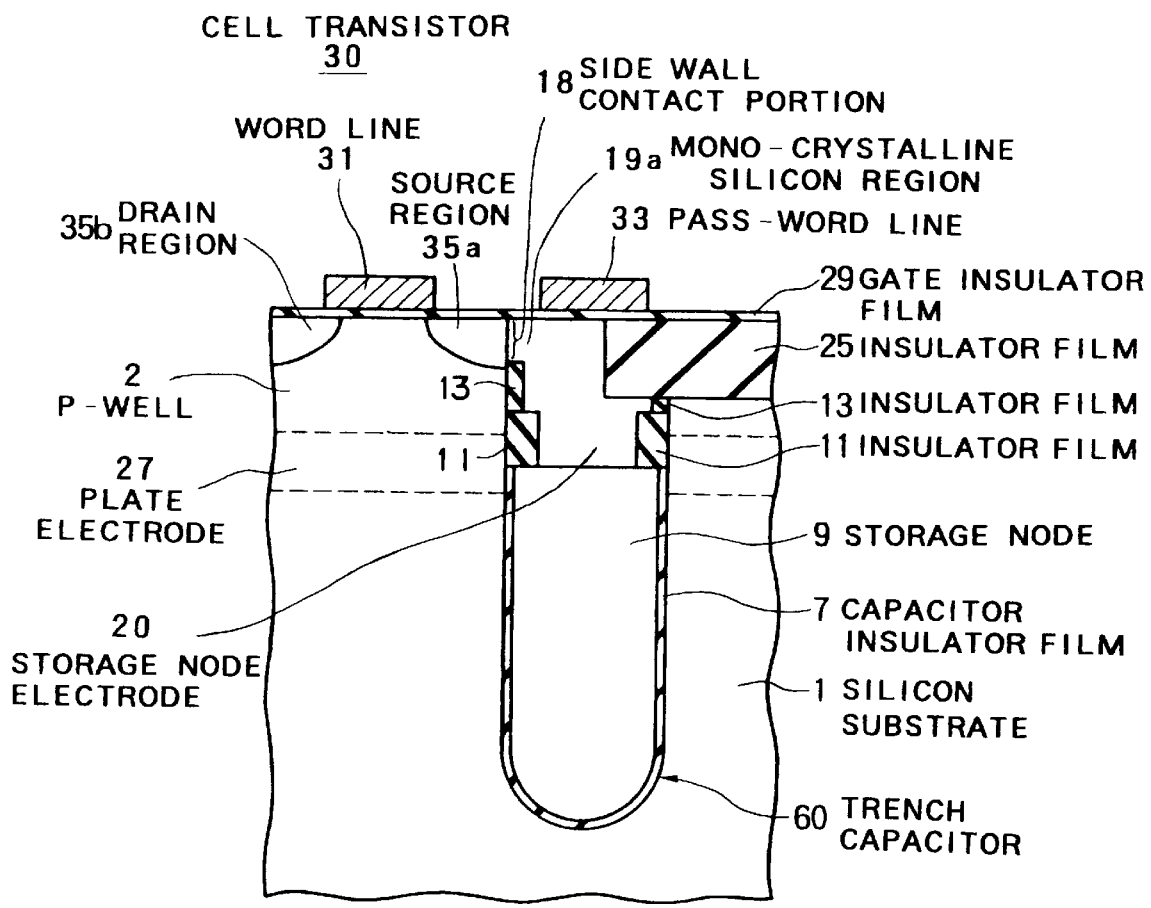
FIG. 24 is a sectional view of the fourth preferred embodiment of the present invention.

Referring to FIG. 24, the fourth preferred embodiment of the present invention will be described below. In this fourth preferred embodiment, a silicon oxide film formed by the CVD method or a film of silicon oxynitride is used in place of the gate insulator film 29 in the first preferred embodiment of a semiconductor memory device, according to the present invention, which is shown in FIG. 1. When the silicon oxide film or the silicon oxynitride film is used, the thickness of the gate insulator film is uniform, so that it is possible to obtain a semiconductor memory device having high reliability. In addition, when the silicon oxynitride film is used, it is possible to prevent boron from penetrating, so that it is possible to form a surface channel type MOS transistor, not a buried channel type MOS transistor. Therefore, it is possible to achieve the scale down of a p-channel MOS transistor of a surrounding circuit portion. In addition, if the silicon oxide film formed by the CVD method or the silicon oxynitride film, which have a high withstand voltage, is used as the gate insulator film 29, it is not required to form an insulator film 25a as shown in FIG. 24. The semiconductor storage device thus formed has the same advantageous effects as those of the first preferred embodiment of a semiconductor storage device according to the present invention. In addition, since it is not required to form the insulator film 25a, the number of producing steps can be decreased in comparison with the steps of producing the first preferred embodiment of a semiconductor storage device according to the present invention.

As described above, according to the present invention, it is possible to obtain a semiconductor storage device which has a memory cell having a good charge holding characteristic without deteriorating the performance of a cell transistor.

While the present invention has been disclosed in terms of the preferred embodiment in order to facilitate better understanding thereof, it should be appreciated that the invention can be embodied in various ways without deparing from the principles of the invention. Therefore, the invention should be understood to include all possible embodiments and modifications to the shown embodiments which can be embodied without departing from the principles of the invention as set forth in the appended claims.

What is claimed is:

1. A semiconductor memory device comprising:
   a semiconductor substrate;
   a semiconductor region of a first conductive type formed in said semiconductor substrate;
   a diffusion region of a second conductive type different from said first conductive type, said diffusion region being formed on a surface of said semiconductor region;
   a trench formed in said semiconductor substrate so as to be adjacent to said diffusion region;
   a capacitor insulator film formed on a portion of a side surface of said trench, which extends from a position at a predetermined depth of said trench to a bottom portion of said trench, and on a bottom surface of said trench;
   a storage node formed so that a surface of said storage node buried in said trench is at the same depth as the position of said predetermined depth of said trench;
   a first insulator film formed in a portion of said side surface of said trench above the position of said predetermined depth of said trench, said first insulator film having a window in a region contacting said diffusion region; and
   a storage node electrode formed on said storage node so as to bury said trench, the uppermost surface of a region of said storage node electrode contacting said diffusion region via said window and being formed of a mono-crystalline silicon region,
   wherein a thickness of an upper portion of said first insulator film on a side of said diffusion region is less than a thickness of a lower portion of said first insulator film.

2. The semiconductor memory device as set forth in claim 1, wherein an MIS transistor is formed in said semiconductor region, and said diffusion region is one of a source region and a drain region of said MIS transistor.

3. The semiconductor memory device as set forth in claim 2, wherein said MIS transistor has a gate insulator film which extends to a portion on said storage node electrode.

4. The semiconductor memory device as set forth in claim 3, wherein said gate insulator film is a CVD oxide film or a silicon oxynitride film.

5. The semiconductor memory device as set forth in claim 1, which further comprises a second insulator film formed on said storage node electrode.

6. The semiconductor memory device as set forth in claim 5, wherein said mono-crystalline silicon region and a region of a polycrystalline silicon are arranged on the uppermost surface of said storage node electrode in parallel, and said second insulator film comprises a third insulator film formed in said mono-crystalline silicon region, and a fourth insulator film formed in said polycrystalline silicon region, said fourth insulator film being thicker than said third insulator film.

7. The semiconductor memory device as set forth in claim 6, wherein said fourth insulator film is buried in said storage node electrode.

8. The semiconductor memory device as set forth in claim 5, wherein an MIS transistor is formed in said semiconductor region, and said diffusion region is one of a source region and a drain region of said MIS transistor.

9. The semiconductor memory device as set forth in claim 8, wherein said MIS transistor has a gate insulator film which extends to a portion on said storage node electrode.

10. The semiconductor memory device as set forth in claim 9, wherein said gate insulator film is a CVD oxide film or a silicon oxynitride film.

11. A semiconductor memory device comprising:
   a semiconductor substrate;
   a semiconductor region of a first conductive type formed in said semiconductor substrate;
   a diffusion region of a second conductive type different from said first conductive type, said diffusion region being formed on a surface of said semiconductor region;
   a trench formed in said semiconductor substrate so as to be adjacent to said diffusion region;
   a capacitor insulator film formed on a portion of a side surface of said trench, which extends from a position at a predetermined depth of said trench to a bottom portion of said trench, and on a bottom surface of said trench;
   a storage node formed so that a surface of said storage node buried in said trench is at the same depth as the position of said predetermined depth of said trench;
   a first insulator film formed in a portion of said side surface of said trench above the position of said predetermined depth of said trench, said first insulator film having a window in a region contacting said diffusion region; and
   a storage node electrode formed on said storage node so as to bury said trench, the uppermost surface of a region of said storage node electrode contacting said diffusion region via said window and being formed of a mono-crystalline silicon region,
   wherein an MIS transistor is formed in said semiconductor region, and said diffusion region is one of a source region and a drain region of said MIS transistor, and said MIS transistor has a gate insulator film which extends to a portion on said storage node electrode, and said gate insulator film is a CVD oxide film or a silicon oxynitride film.

12. The semiconductor memory device as set forth in claim 11, which further comprises a second insulator film formed on said storage node electrode.

13. The semiconductor memory device as set forth in claim 12, wherein said mono-crystalline silicon region and a region of a polycrystalline silicon are arranged on the uppermost surface of said storage node electrode in parallel, and said second insulator film comprises a third insulator film formed in said mono-crystalline silicon region, and a fourth insulator film formed in said polycrystalline silicon region, said fourth insulator film being thicker than said third insulator film.

14. The semiconductor memory device as set forth in claim 13, wherein said fourth insulator film is buried in said storage node electrode.

* * * * *